«12» United States Patent
Jeng

(10) Patent No.: US 7,994,046 B2
(45) Date of Patent: Aug. 9, 2011

(54) METHOD FOR FORMING A DIELECTRIC LAYER WITH AN AIR GAP, AND A STRUCTURE INCLUDING THE DIELECTRIC LAYER WITH THE AIR GAP

(75) Inventor: Shin-Puu Jeng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 341 days.

(21) Appl. No.: 11/342,099

(22) Filed: Jan. 27, 2006

(65) Prior Publication Data

US 2007/0178713 A1    Aug. 2, 2007

(51) Int. Cl.
*H01L 21/4763*  (2006.01)
(52) U.S. Cl. ........ 438/619; 438/622; 438/637; 438/700; 438/745; 438/902; 257/758; 257/774; 257/E23.142; 257/E23.145
(58) Field of Classification Search .............. 438/619, 438/622, 626, 629, 637, 639, 700, 704, 706, 438/745, FOR. 118, FOR. 355, 902; 257/758, 257/774, E23.142, E23.145
See application file for complete search history.

(56) References Cited

U.S. PATENT DOCUMENTS

| 6,004,883 | A | 12/1999 | Yu et al. |
|---|---|---|---|
| 6,127,711 | A | 10/2000 | Ono |
| 6,268,261 | B1 | 7/2001 | Petrarca et al. |
| 6,492,245 | B1 * | 12/2002 | Liu et al. .................. 438/422 |
| 6,610,593 | B2 | 8/2003 | Kohl et al. |
| 6,635,967 | B2 | 10/2003 | Chang et al. |
| 6,660,661 | B1 | 12/2003 | Ben-Tzur et al. |
| 6,841,878 | B1 | 1/2005 | Ben-Tzur et al. |
| 6,903,002 | B1 | 6/2005 | Ben-Tzur et al. |
| 6,946,384 | B2 | 9/2005 | Kloster et al. |
| 6,949,456 | B2 | 9/2005 | Kumar |
| 2005/0074960 | A1 | 4/2005 | Gueneau de Mussy et al. |
| 2005/0074961 | A1 | 4/2005 | Beyer et al. |
| 2007/0178713 | A1 | 8/2007 | Jeng |

* cited by examiner

*Primary Examiner* — N Drew Richards
*Assistant Examiner* — Joannie A Garcia
(74) *Attorney, Agent, or Firm* — Duane Morris LLP

(57) ABSTRACT

A method of forming a semiconductor structure includes providing a first dielectric layer with an opening above a substrate. An exposed surface portion of the first dielectric layer in the opening is transformed. A protective dielectric layer is formed along the transformed portion of the first dielectric layer. The opening is filled with a conductive material. The transformed portion of the first dielectric layer is removed to form an air gap between the protective dielectric layer and a remaining portion of the first dielectric layer.

27 Claims, 25 Drawing Sheets

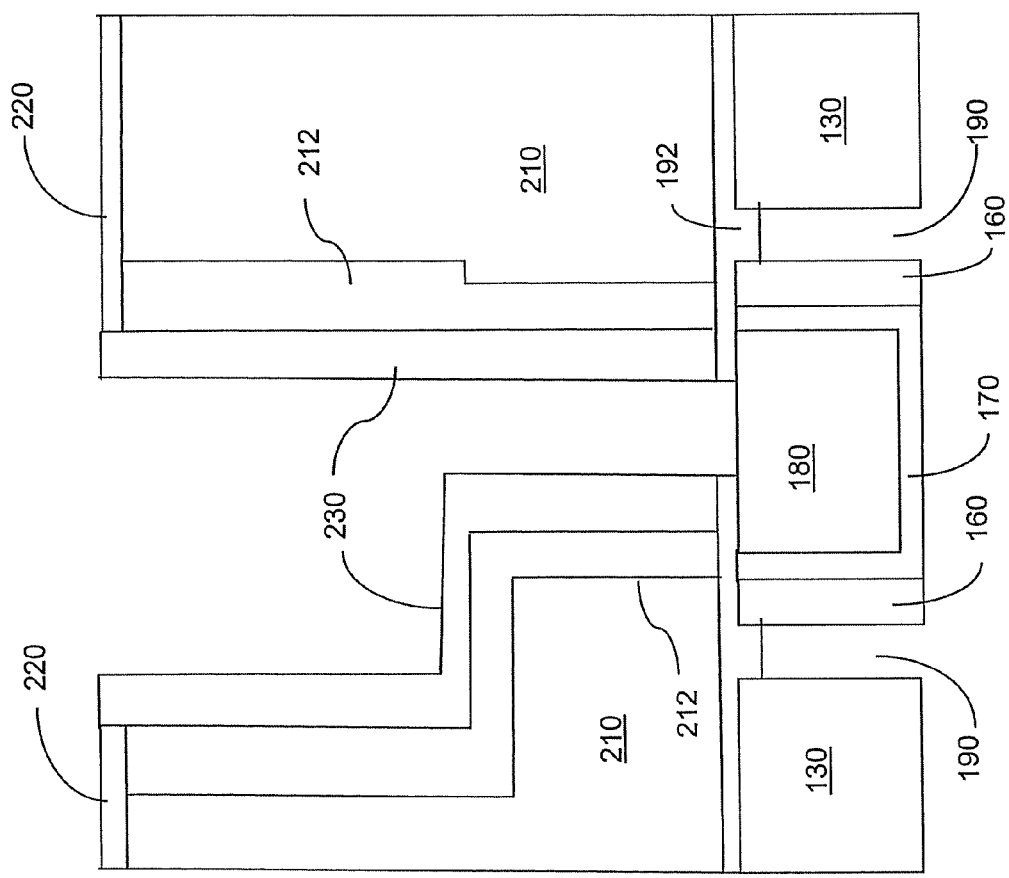

METHOD FOR FORMING A DIELECTRIC LAYER WITH AN AIR GAP, AND A STRUCTURE INCLUDING THE DIELECTRIC LAYER WITH THE AIR GAP

FIELD OF THE INVENTION

The present invention is directed to semiconductor fabrication generally, and more specifically to interconnects.

BACKGROUND

As the semiconductor industry migrates to 90 nanometer and smaller technologies, the minimum distance between adjacent interconnect lines grows smaller. Inter-level dielectric materials (ILD) such as silicon oxide are being replaced by low-k dielectric materials, to reduce the capacitance between nearby interconnect lines. At the 32 and 45 nanometer nodes, the capacitance problem is even more acute. Typical methods to reduce capacitance between interconnect lines use an ILD (Inter-Layer-Dielectric) or IMD (Inter-Metal-Dielectric) material with a lower k value, such as FSG, carbon-doped silicon oxide(e.g., BLACK DIAMOND) and extreme low-k (ELK) dielectrics having a k value less than 2.5 to reduce interconnect capacitance.

Dielectric materials with reduced k have a lower mechanical strength. There are many reliability issues when using ELK dielectrics, in particular packaging problems. ELK film strength is about 50% weaker than low-K. When ELK and ultra low-k (ULK) materials are used, the thermal mismatch between the die and the package substrate can cause cracking and/or delamination of the ILD material. Use of ELK also has a high cost. Integration of ELK requires a very complicated process flow (e.g. pore sealing, UV/e-beam cure, and the like), which increases cost and cycle time. ELK has a low thermal conductivity (<0.2 W/m−C), which impedes thermal dissipation and causes electromigration and other thermal related reliability problems.

U.S. Patent Application Publication No. US 2005/0074961 describes a method for the production of air gaps in a semiconductor device. Air is used for its dielectric and insulation properties. The formation of air gaps is accomplished, in part, by chemically and/or mechanically changing the properties of a first dielectric layer locally, such that at least part of the first dielectric layer is converted locally and becomes etchable by a first etching substance. The local conversion of the dielectric material may be achieved during anisotropic etching of the material in oxygen containing or fluorine containing plasma or ex-situ by performing an oxidizing step (e.g., a UV/ozone treatment or supercritical carbon dioxide with addition of an oxidizer). Formation of air gaps is achieved after creation of conductive lines and, alternatively, a barrier layer by a first etching substance. The air gaps are formed in a dual damascene structure, near the vias and/or the trenches of the damascene structure.

Improved methods of reducing capacitance between interconnect lines are desired.

SUMMARY OF THE INVENTION

In some embodiments, a method of forming a semiconductor structure includes providing a first dielectric layer with an opening above a substrate. An exposed surface portion of the first dielectric layer in the opening is transformed. A protective dielectric layer is formed along the transformed portion of the first dielectric layer. The opening is filled with a conductive material. The transformed portion of the first dielectric layer is removed to form an air gap between the protective dielectric layer and a remaining portion of the first dielectric layer.

In some embodiments, a structure includes a semiconductor substrate. A layer of a first dielectric material has an opening above the substrate. The opening has side walls. A conductive line or conductive via is provided within the opening of the layer of the first dielectric material. A protective dielectric material is formed around the conductive line or conductive via. The protective dielectric material can be same or different from the first dielectric material. The layer of the first dielectric material has an air gap between the protective dielectric material and the side walls of the respective opening thereof.

In some embodiments, a structure includes a semiconductor substrate. A first dielectric layer and a second dielectric layer each have an opening above the substrate. The openings of the first and second dielectric layers each have side walls. The opening of the second dielectric layer at least partially overlies the opening of the first dielectric layer. A respective conductive line or conductive via is provided within the respective opening of each of the first and second dielectric layers. A protective dielectric material is formed around each conductive line or conductive via. The first and second dielectric layers each have an air gap between the protective dielectric material and the side walls of the respective opening thereof. A capping layer is provided between the first and second dielectric layers. The capping layer isolates the air gap of the second dielectric layer from the air gap of the first dielectric layer.

BRIEF DESCRIPTION OF THE DRAWINGS

FIGS. 2A to 2H show a dual damascene structure and method of forming the same over the structure of FIGS. 1A to 1J.

DETAILED DESCRIPTION

Figure 1A:
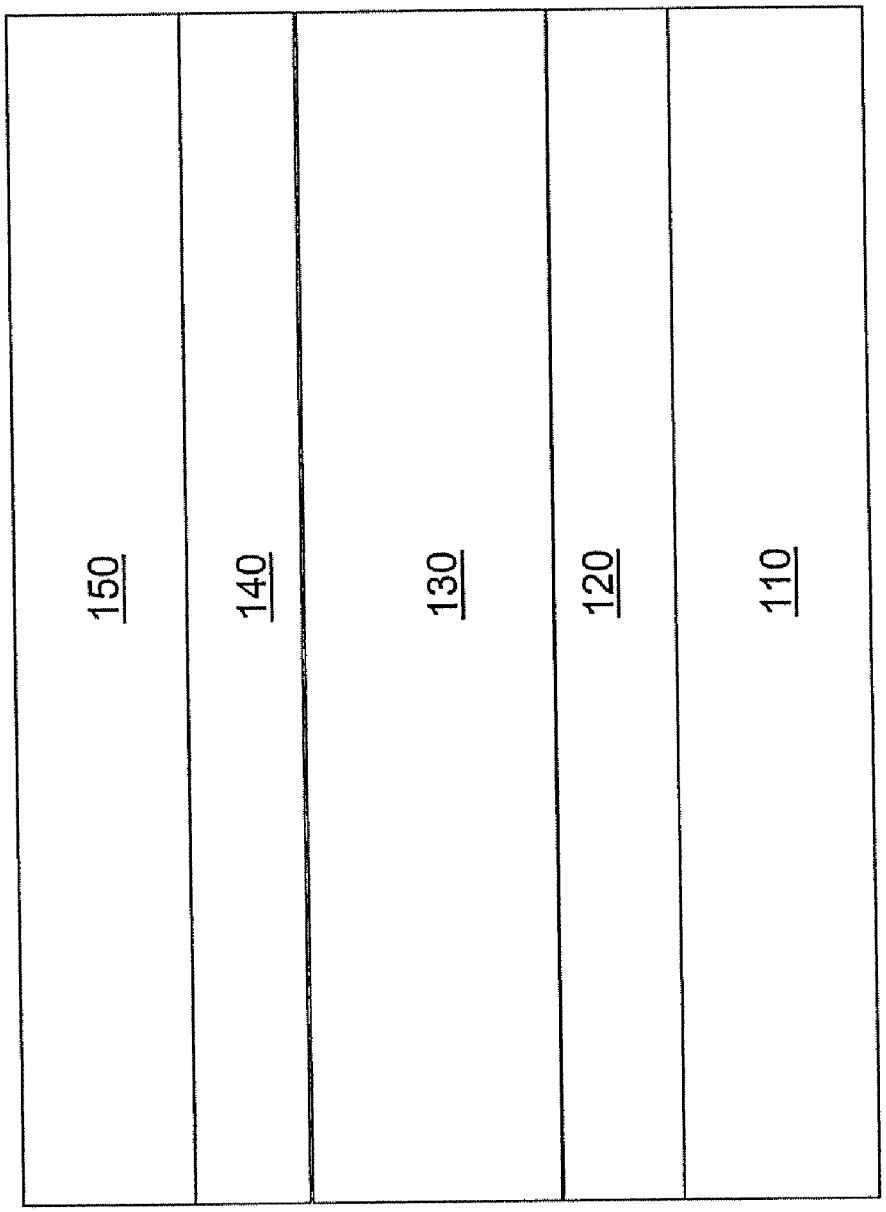
FIGS. 1A to 1J show a single damascene structure and method for forming the same, according to an embodiment of the invention.

U.S. Patent Application Publication No. US 2005/0074961, published Apr. 7, 2005 (application Ser. No. 10/957,514, filed Sep. 30, 2004), is incorporated by reference herein in its entirety.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Figure 1B:
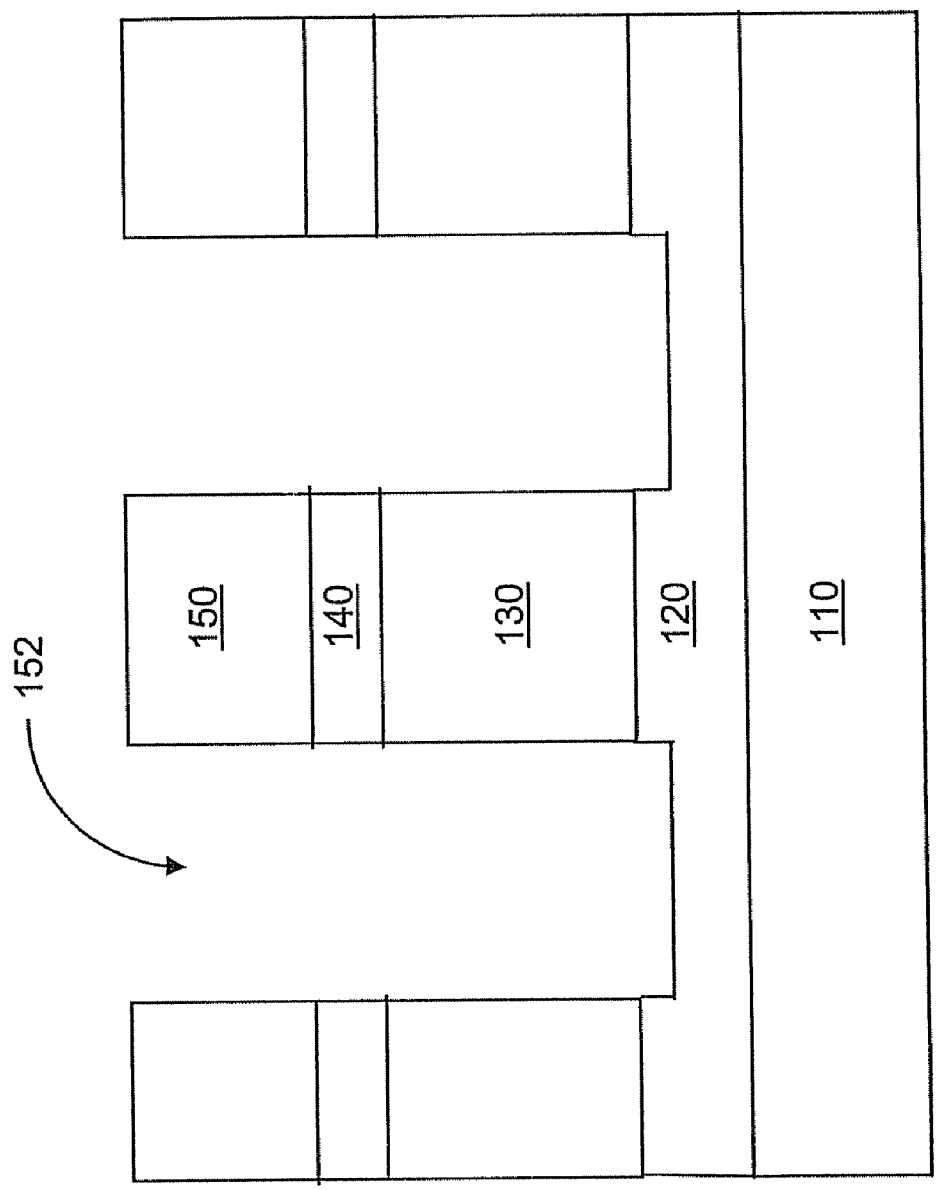
Figure 1C:
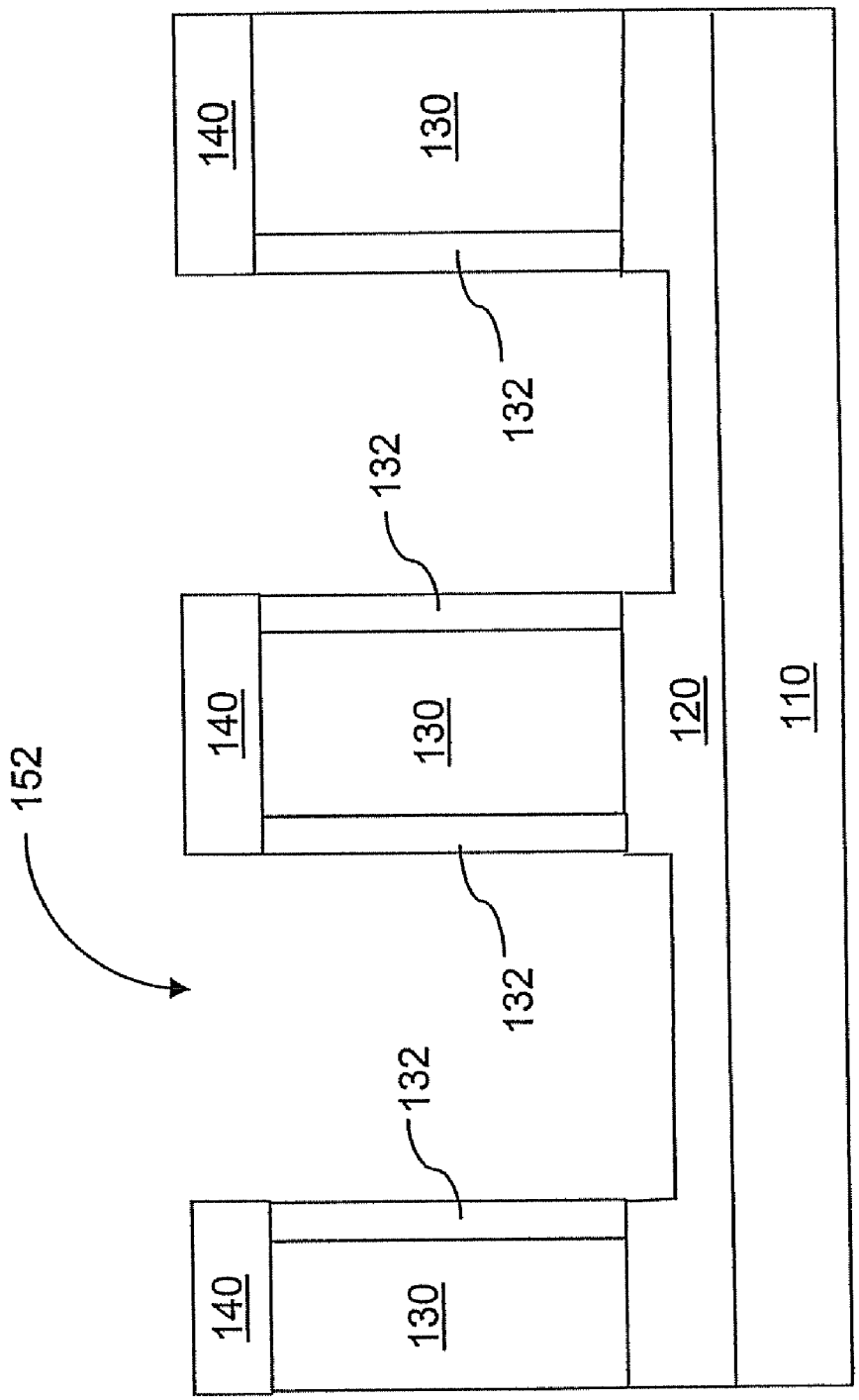
Figure 1D:
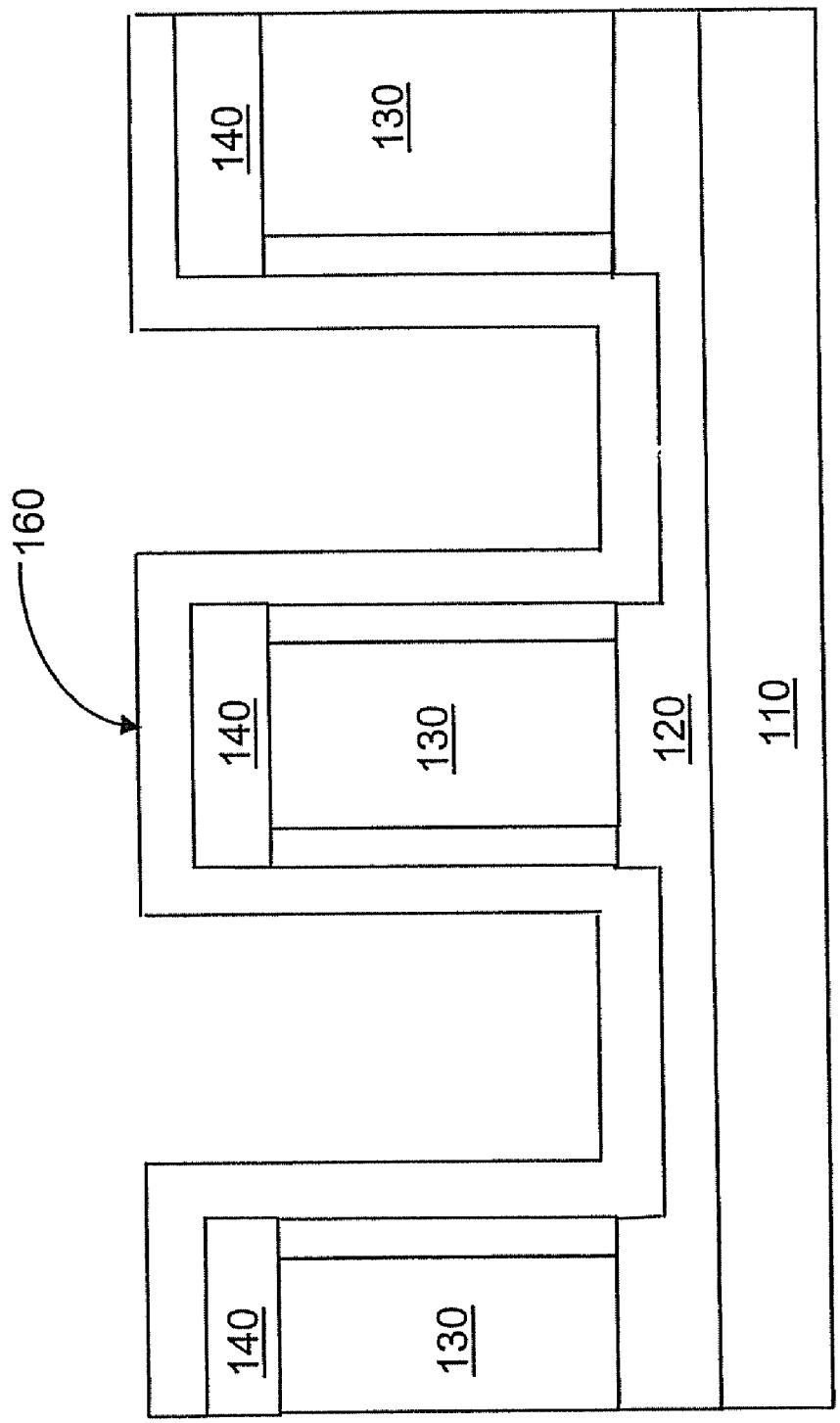
Figure 1E:
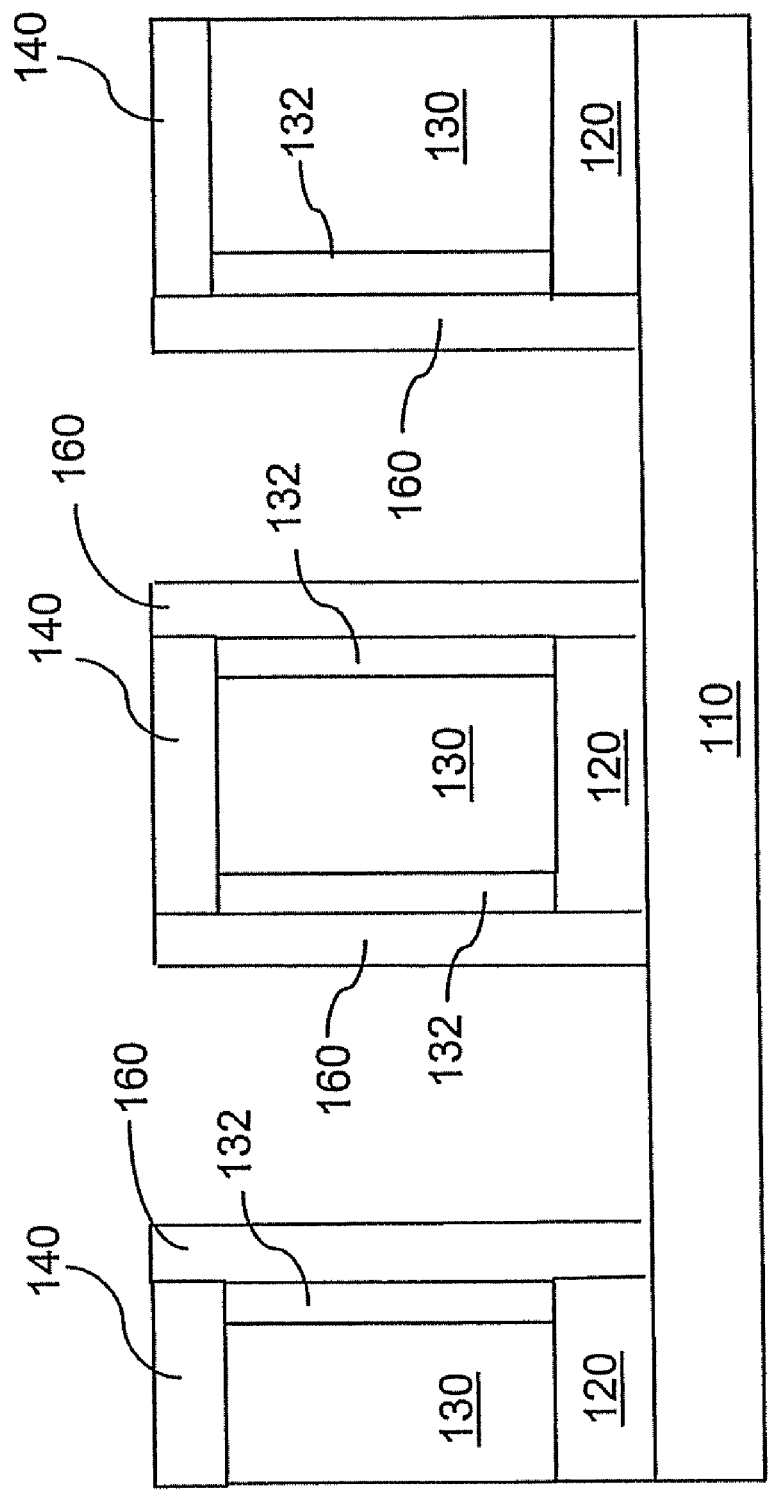
Figure 1F:
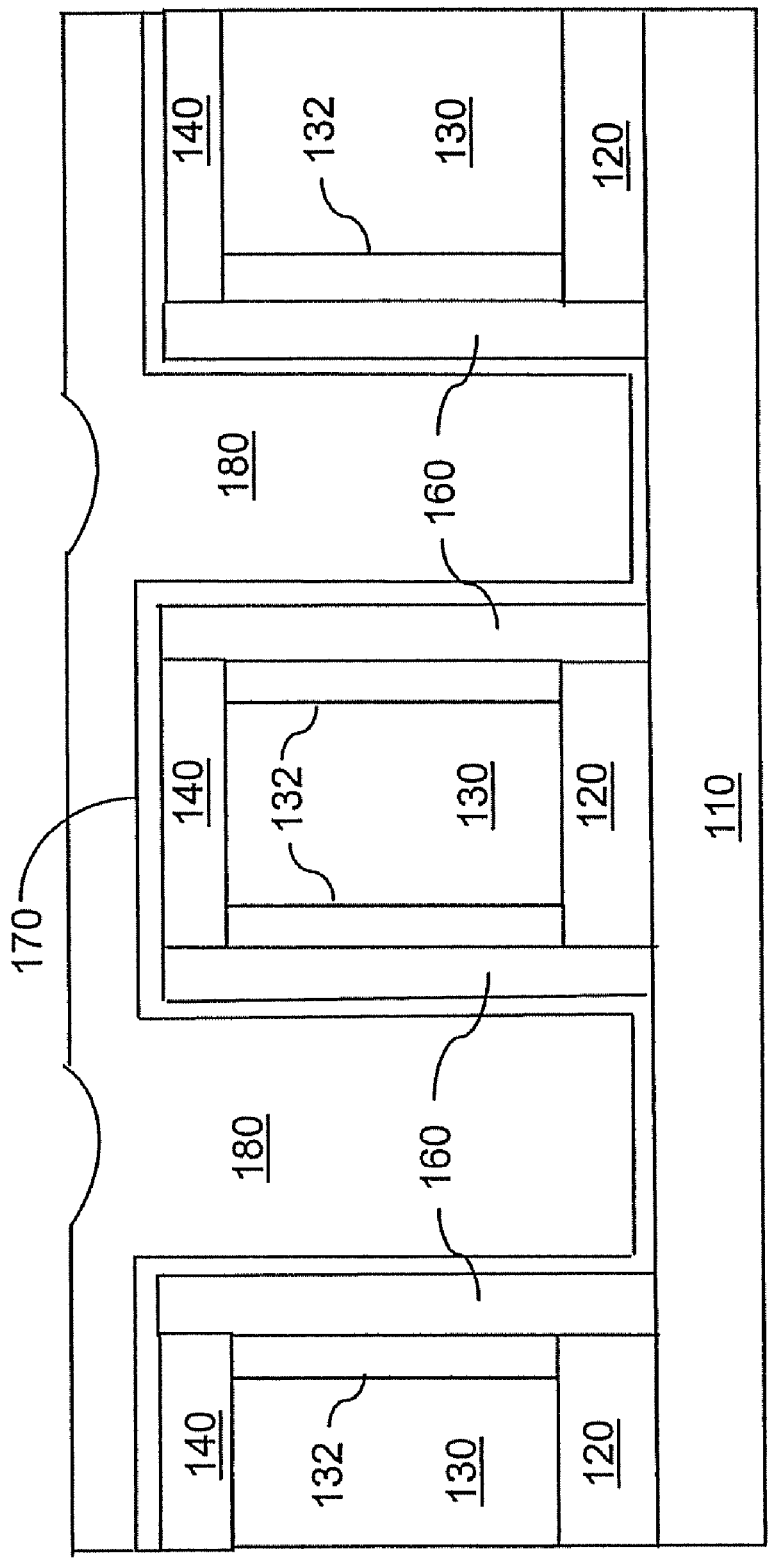
Figure 1G:
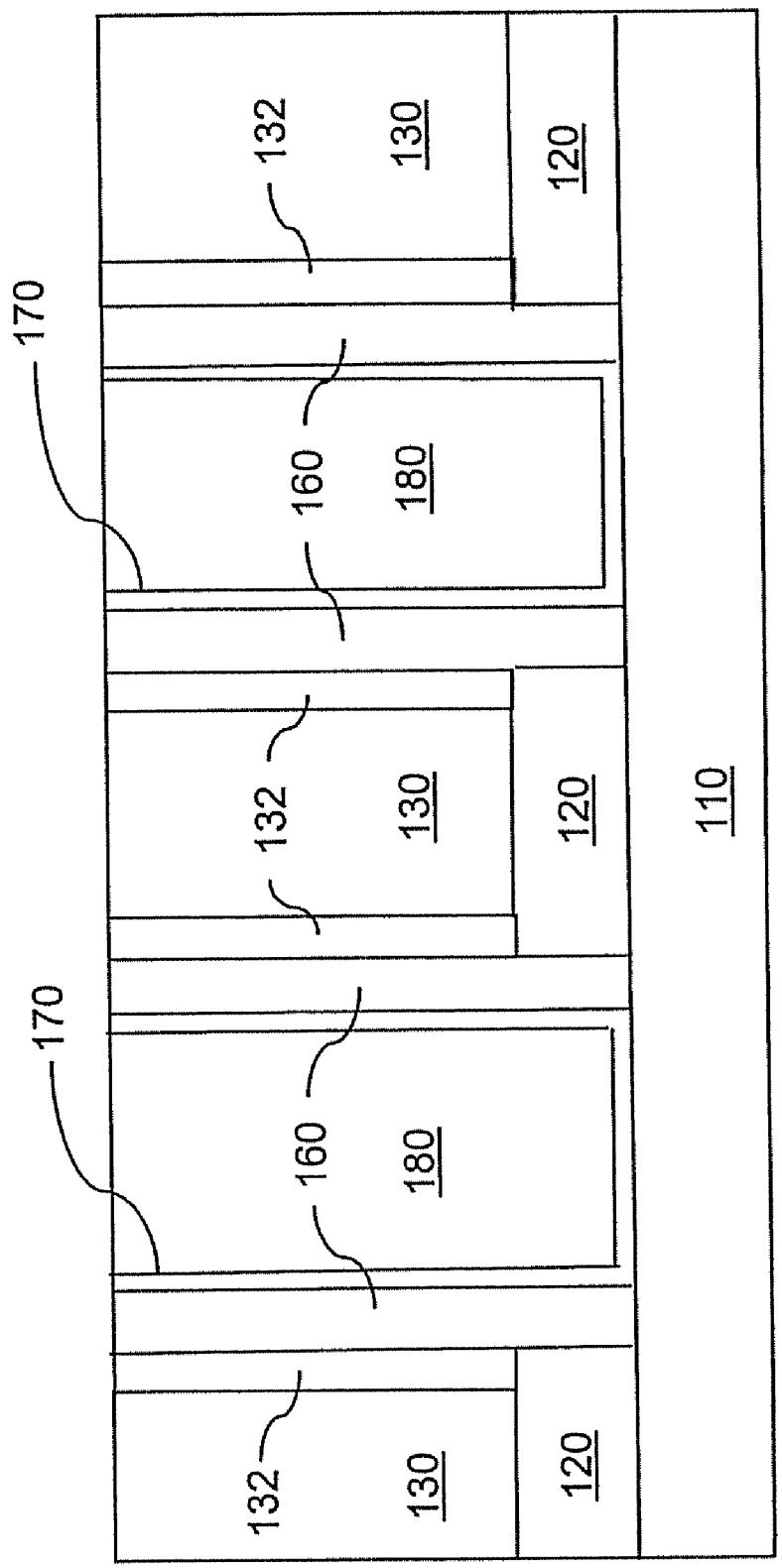
Figure 1H:
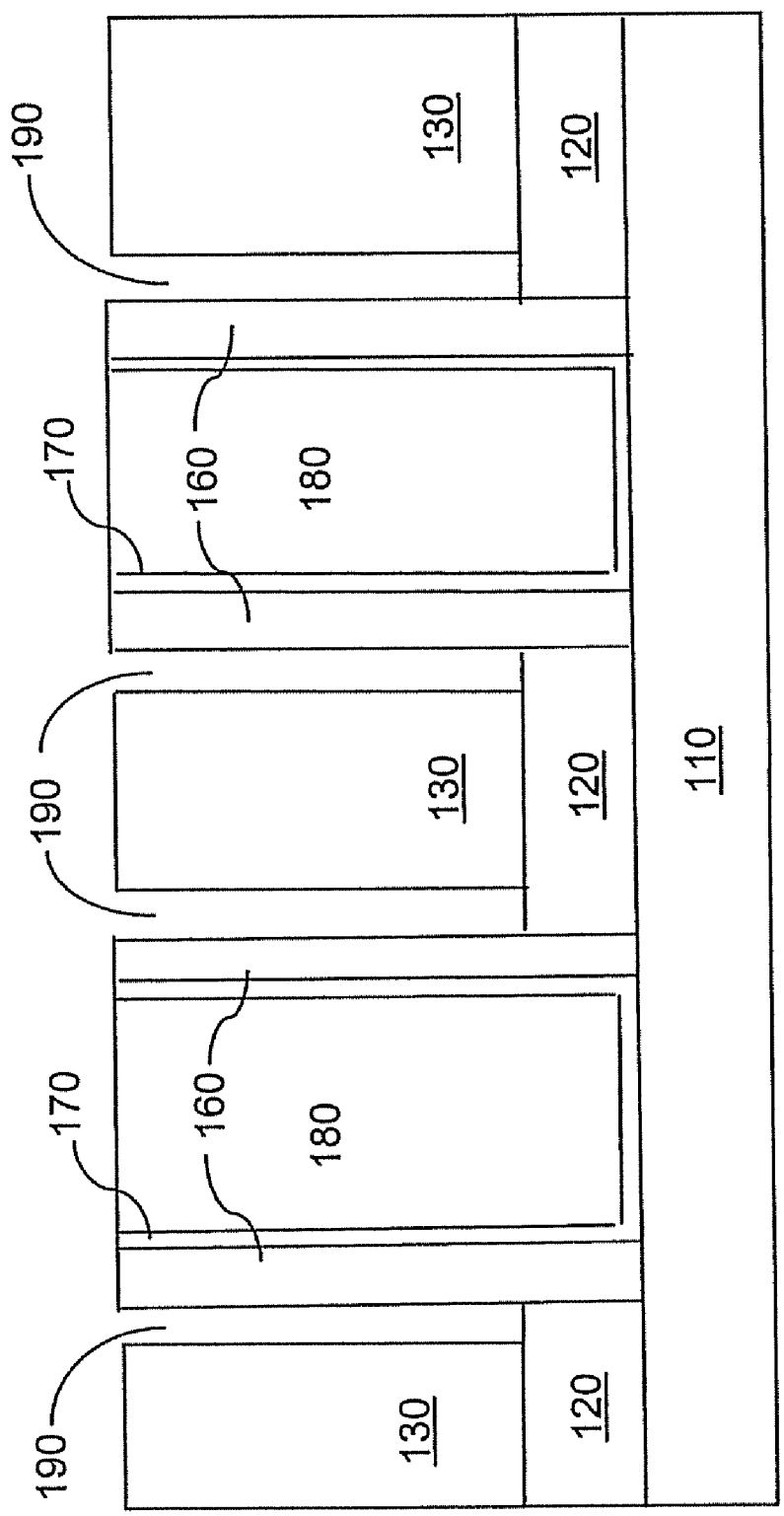
Figure 1I:
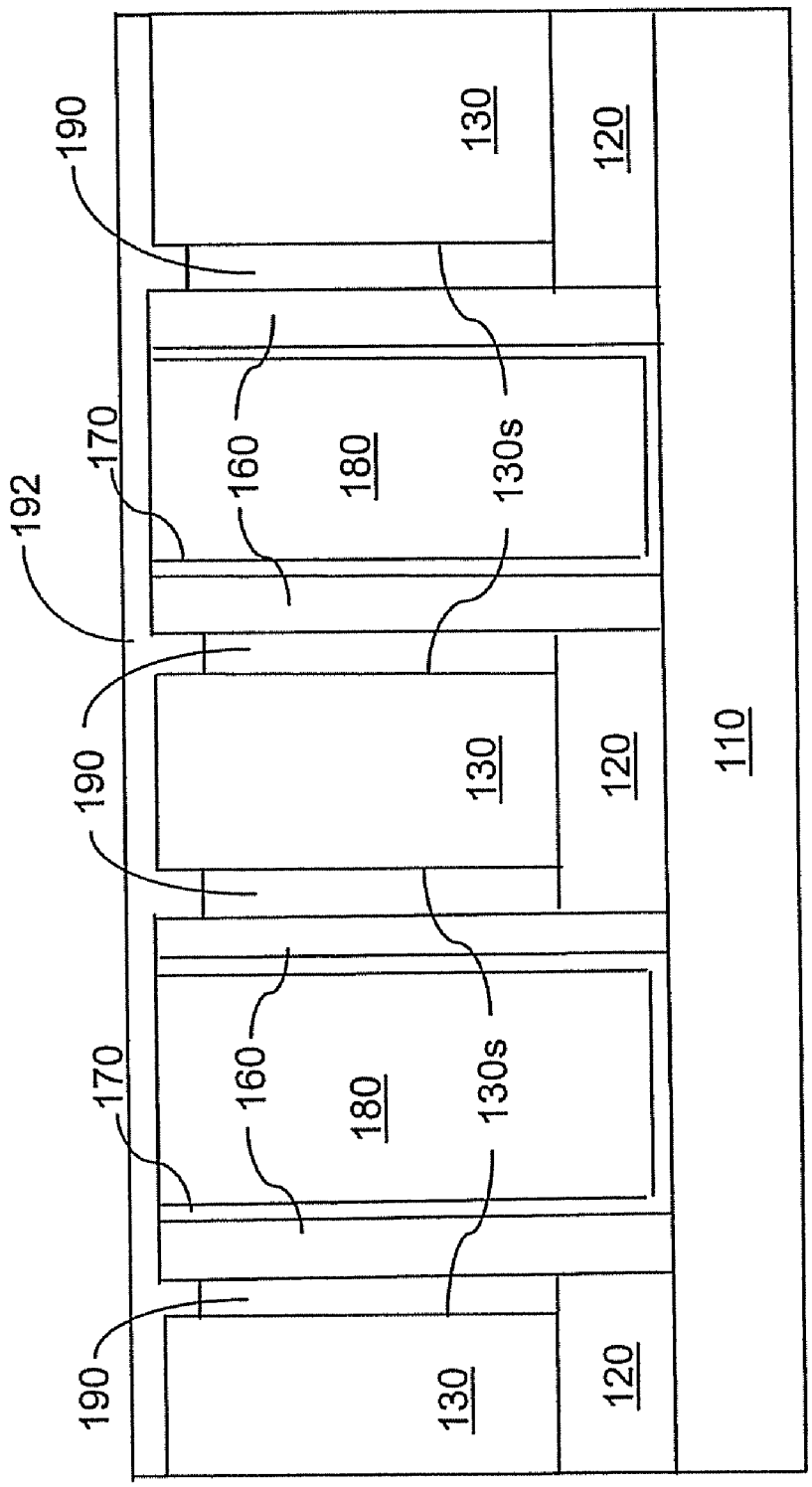

FIG. 1I is a cross sectional view of an interconnect structure 100, according to an embodiment of the invention. The structure 100 in FIG. 1I is a single damascene interconnect layer, such as the M1 layer of an integrated circuit (IC) die. The structure 100 includes a semiconductor substrate 110. The substrate 110 may be a bulk semiconductor material with diffusion regions (not shown) therein, or a semiconductor material having a plurality of layers (not shown) with conductive traces, and passive and active devices formed thereon. The substrate 110 may further include one or more interconnect layers (not shown) formed above the passive and active device layers. Thus, although the structure shown in FIG. 1 may be the M1 layer, the structure may also be formed at another level above the M1 layer. The substrate 110 may be glass, bulk silicon, III-V (GaAs or the like) compound semiconductor, SOI, GOI, or other substrate.

An etch stop layer 120 is provided over the substrate 110. The etch stop layer 120 may be carbon-containing dielectric like silicon carbide (SiC) or silicon nitride or other dielectric material, for example, and may be about 600 Angstroms thick or less.

The ILD material 130 ("the first dielectric material") is formed by Chemical Vapor Deposition (CVD) or spin-on-method above the etch stop layer 120. Thickness of the ILD material 130 is from about 100 nm to about 700 mn. The ILD material 130 maybe any dielectric having a k-value of about 10 or less. In some embodiments, the ILD material 130 is a low-k dielectric with k less than 4.0. In some embodiments, the ILD material 130 has a k value less than 3.0. The ILD material 130 may be a high-k, low-k, ELK or ULK dielectric material. In some embodiments, the ILD material is "BLACK DIAMOND" OSG low-k dielectric by Applied Materials of Santa Clara, Calif. In some embodiments, the ILD material 130 is SiOC. The ILD material 130 may be a porous film, a carbon-doped dielectric, Organo Silicate Glass (OSG), also commonly referred to as SiOC:H materials, fluorine-doped silicate glass(FSG), organic low-k, (hydrogenated) silicon oxycarbides or Carbon doped silicon oxides, or MethylSilsesQuioxane (MSQ).

The etch stop layer 120 and ILD 130 have openings, in which one or more lines 180 of conductive material are formed. The opening having side walls 130s.

In some embodiments, the conductive material 180 is copper or copper alloy, but other conductive materials such as aluminum or aluminum alloy, tungsten, gold, silver, other metals, alloys, semiconductors or conductive polymers may be used.

Each line 180 has a barrier layer 170 below and along the sides of the line. The barrier layer 170 may be a tantalum nitride (TaN) or TaN/Ta barrier, for example, or another suitable diffusion barrier such as, but not limited to, Ta, titanium nitride (TiN), Ti, WN and WCN, or combinations of any of these materials. The barrier 170 may be a single-layer barrier or a multi-layer barrier.

A protective dielectric material 160 is formed around the conductive line 180. The protective dielectric material 160 can be any material including low-k or high-k (e.g., k<about 10) dielectric. The protective dielectric material 160 provides mechanical support and protection for the conductive lines 180. The protective dielectric material 160 surrounds the sides of the metal lines 180 and prevents stress migration and electomigration, improving reliability. The protective dielectric layer prevents the etching liquid from going to the bottom of the line undercutting the metal, reducing peeling. Owing to the protective dielectric material 160 avoids the conductive line 180 exposed to air, the problem of time dependent dielectric breakdown (TDDB) is reduced.

The protective dielectric material 160 may be formed of a different dielectric material from the first dielectric material. In other embodiments, the protective dielectric material 160 may be the same as the ILD material 130. In some embodiments, the protective dielectric layer is one of the group consisting of SiC, undoped silicon oxide, doped silicon oxide, silicon oxynitride, carbon-doped silicon oxide, silicon nitride, FSG, PSG, and CVD polymers, such as parylene, polyimide and BCB, or combinations thereof. In some embodiments, the protective dielectric layer 160 has a thickness less than about 2000 Angstroms. In other embodiments, the thickness of protective dielectric 160 is less than about 300 Angstroms, and maybe about 100 Angstroms.

The layer of the first dielectric material 130 has at least one air gap 190 between the protective dielectric material 160 and the side walls 130s of the respective opening thereof. Preferably, each of the trenches containing a conductive line 180 has a respective air gap 190 between the protective dielectric material 160 and the side walls 130s. The air gap may have a width from about 5 nanometers to about 400 nanometers.

A capping layer 192 covers the ILD layer 130. The capping layer 192 may be made of SiC, or another of the protective dielectric materials listed above. The capping layer 192 seals the air gaps 190. The capping layer 192 also isolates the air gap from any structure formed above the capping layer, as discussed below with reference to FIG. 4.

Figure 2A:
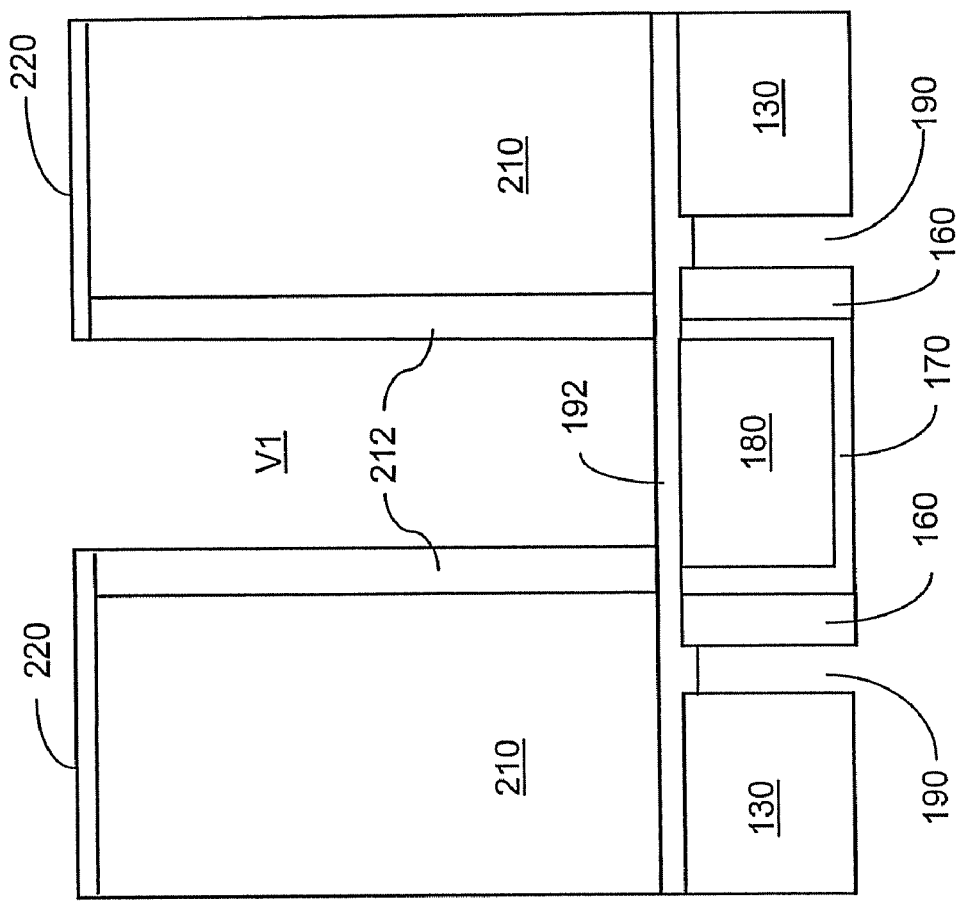
Figure 2B:
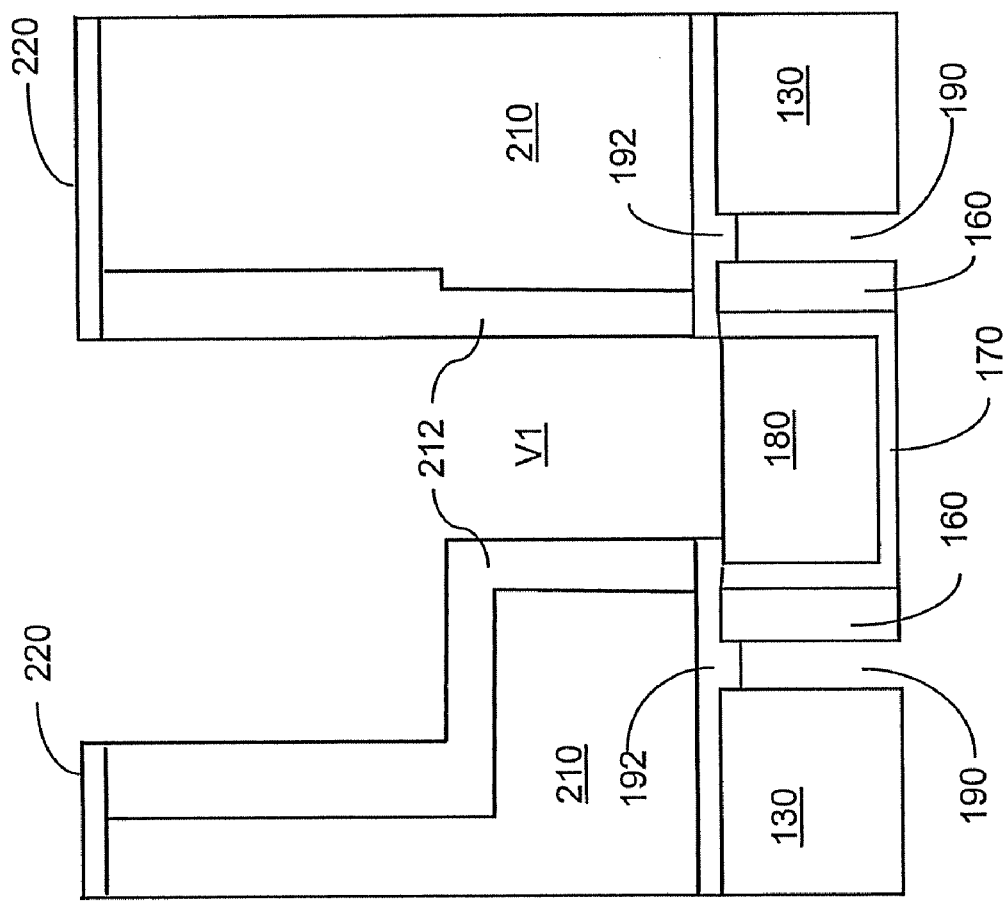
Figure 2C:
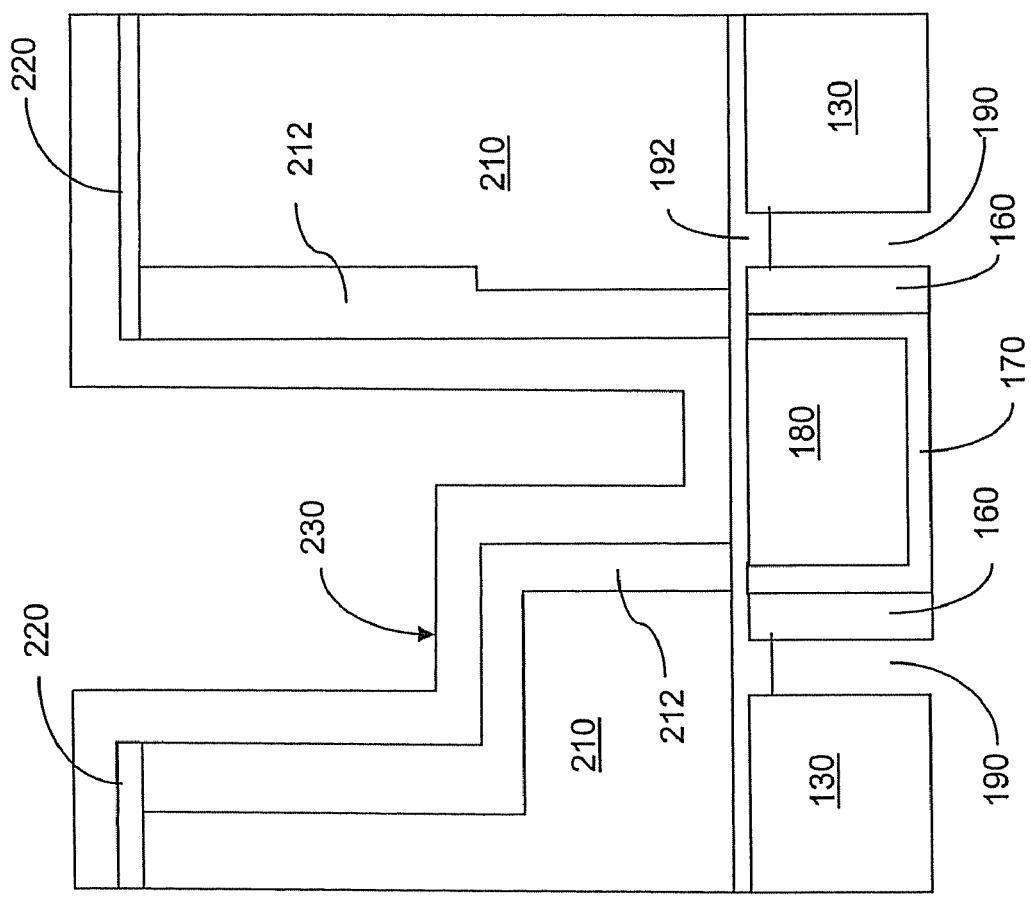
Figure 2E:
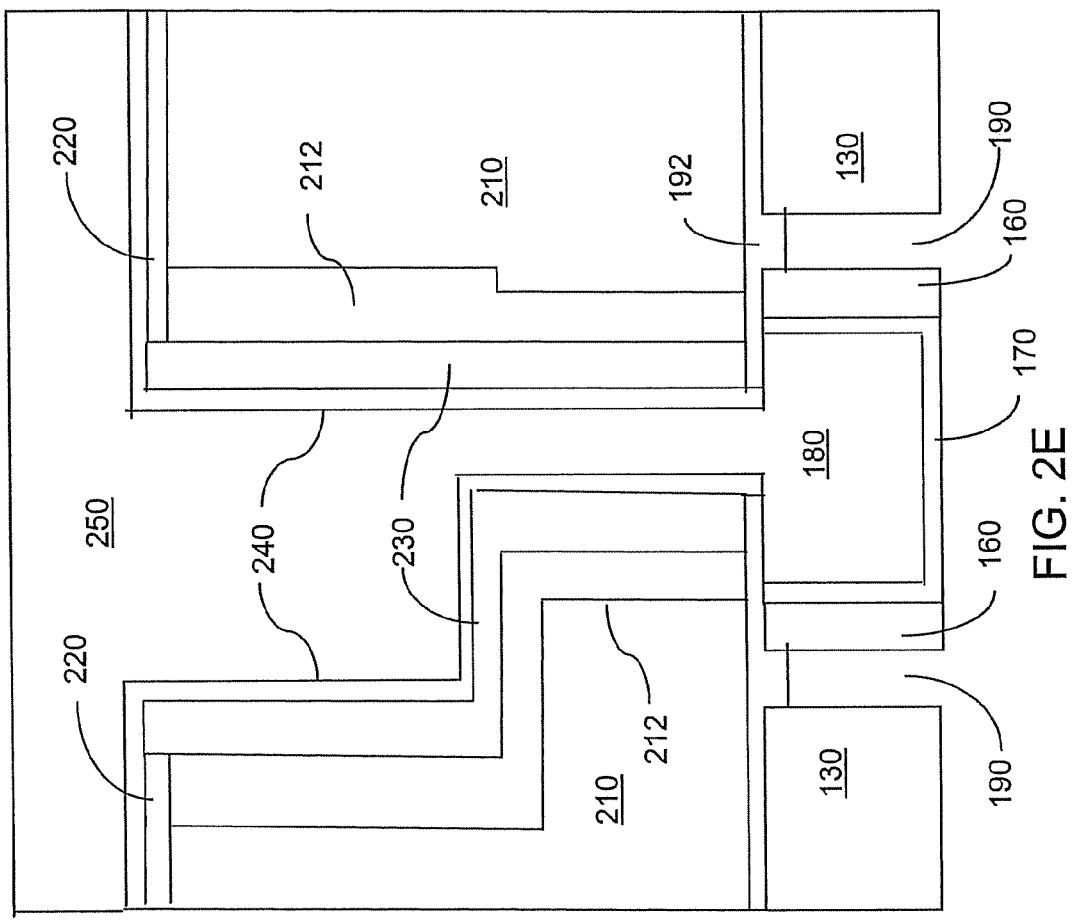
Figure 2F:
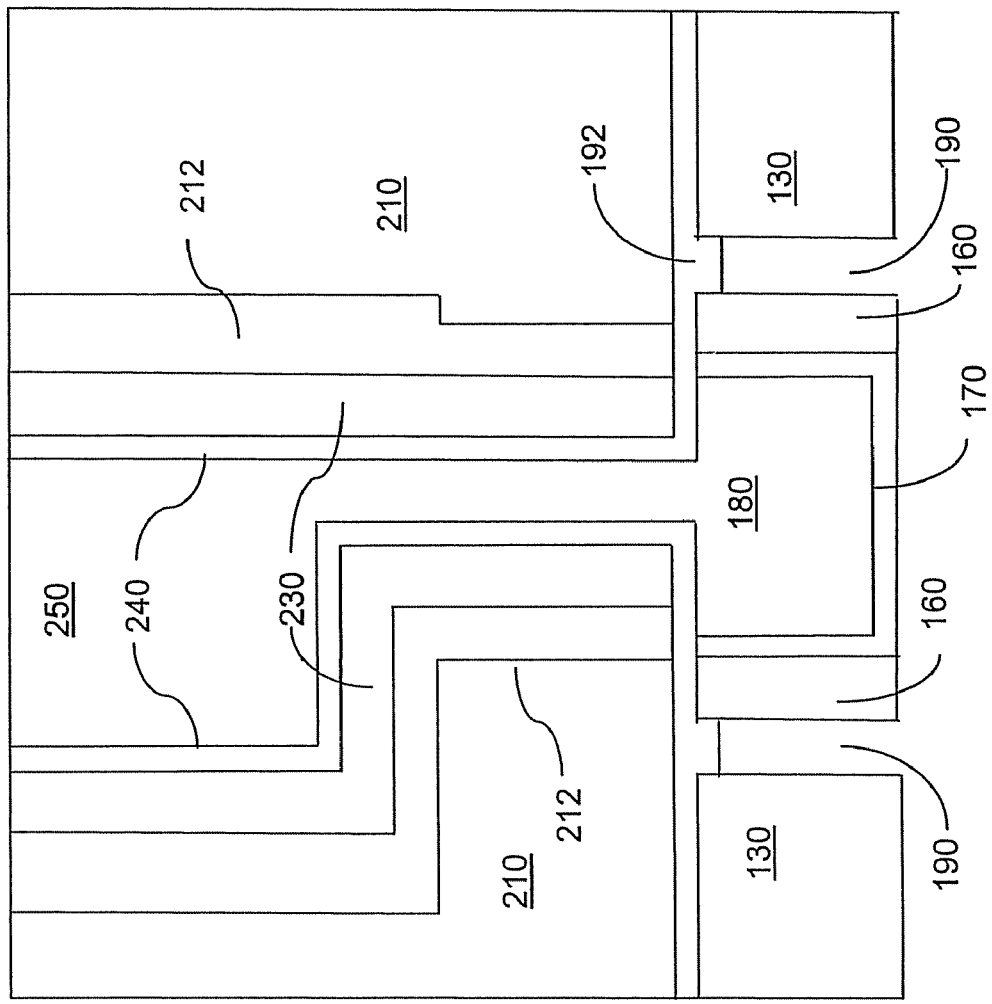
Figure 2G:
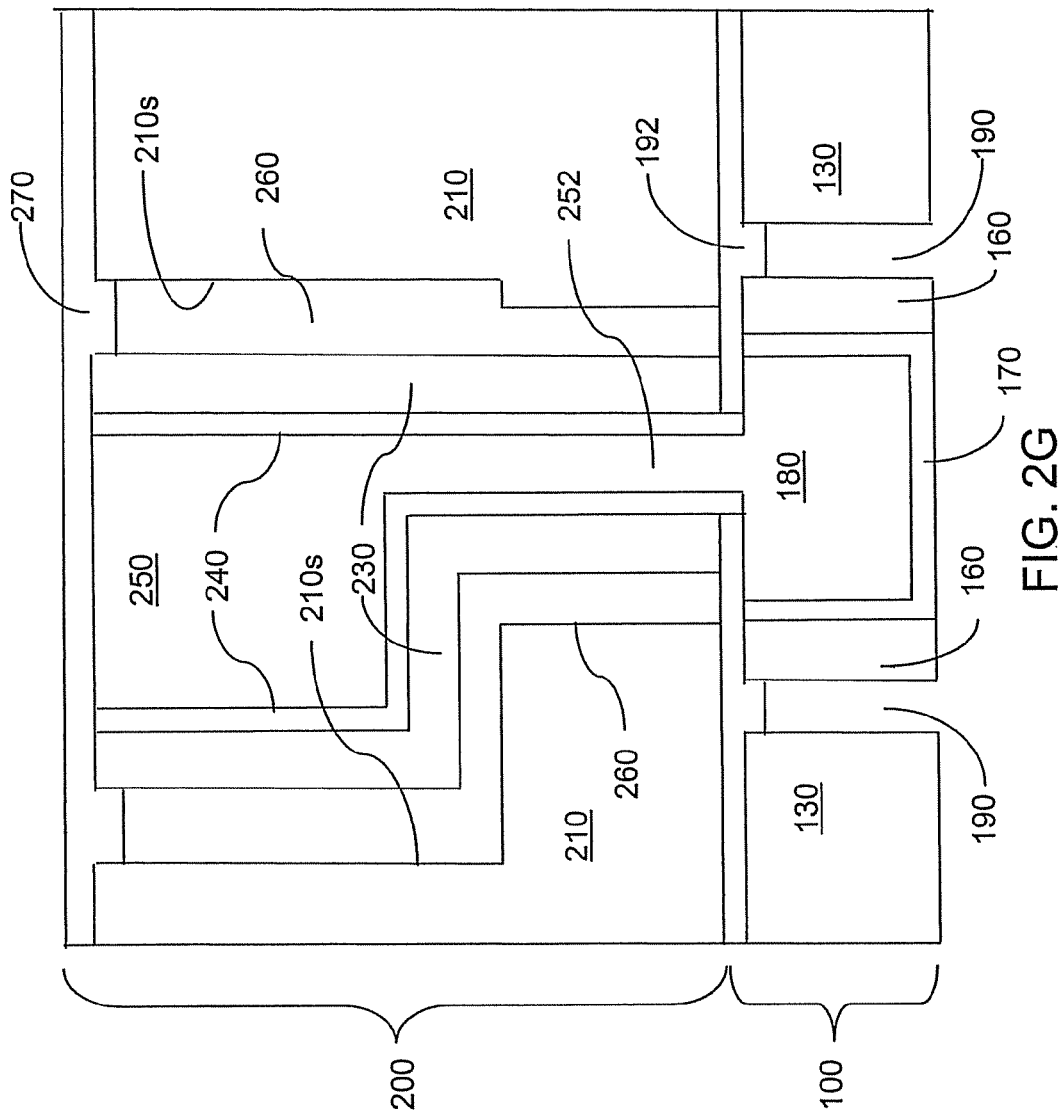

FIG. 2G is a cross sectional view showing an interconnect structure 200, according to an embodiment of the invention. The structure 200 in FIG. 2G is a dual damascene interconnect layer, such as the M2/V1 layer of an integrated circuit (IC) die. Structure 200 may be formed over a single damascene layer, such as M1 layer 100 shown in FIG. 2G. The die may have a plurality of dual damascene layers (M3/V2, M4/V3, etc.), so that the structure 200 may be formed over another dual damascene layer (not shown in FIG. 2G).

In the example of FIG. 2G, the single damascene level 100 is the same structure shown in FIG. 1I and described above, except that during formation of the M2/V1 layer, an opening is formed in capping layer 192, as described below. A description of the single damascene level 100 is not repeated.

The dual damascene structure 200 includes an ILD material 210 formed above the capping layer 192. The ILD material 210 may be any dielectric having a k value of about 10 or less. Preferably, the ILD material 210 is the same material used for ILD layer 130. The capping layer 192 and ILD 210 have openings, in which one or more lines 250 of conductive material and one or more conductive vias 252 are formed. The opening having side walls 210s.

The conductive material 250 is preferably the same material as used for conductive lines 180. Each line 250 has a barrier layer 240 below and along the sides of the line. Each via 252 has the barrier layer 240 along the sides thereof. Preferably, the barrier layer 240 is formed of the same material as barrier layer 170, but in alternative embodiments, another suitable diffusion barrier material may be used.

A protective dielectric material 230 is formed around the conductive line 250 and around the conductive via 252. The protective dielectric material 230 makes continuous contact with sides and a bottom of the conductive line 250 and with sides of the conductive via 252. The protective dielectric material 230 provides mechanical support and protection for the conductive lines 250 and conductive vias 252. In some embodiments, the protective dielectric material 230 is formed of the same material as protective dielectric material 160. In other embodiments, the material 230 can be a different protective dielectric material from the material 160.

The layer of the first dielectric material 210 has at least one air gap 260 between the protective dielectric material 230 and the side walls 210s of the respective opening thereof. The air gap 260 extends continuously, adjacent to portions of the protective dielectric material 230 along sides and a bottom of the conductive line 250 and along sides of the conductive via 252. Preferably, each of the trenches containing a conductive line 250 has a respective air gap 260 between the protective dielectric material 230 and the side walls 210s.

A capping layer 270 covers the ILD layer 210. The capping layer 270 seals the air gaps 260. The capping layer 270 also isolates the air gaps 260 from any structure or air gap formed above the capping layer 270, as discussed below with reference to FIG. 4.

As readily seen in FIG. 2G, the capping layer 192 between the first level dielectric layer 130 and the second level dielectric layer 210 isolates the V2 via 252 of the second dielectric layer 210 from the air gap 190 of the first dielectric layer 130. In the same manner, the capping layer 270 isolates the air gap 260 from the V3 via (not shown).

FIGS. 1A to 1I show an exemplary process for forming a single damascene structure 100, or the M1 level of a multi-level interconnect structure.

In FIG. 1A, an etch stop layer 120 is formed over the substrate 110. The first dielectric material 130 is formed over the etch stop layer 120. An anti-reflective coating (ARC) layer 140 is formed over the dielectric material 130. A photoresist 150 is formed over the ARC layer 140. Each of these layers may be formed by any suitable process, such as spin-coating, chemical vapor deposition (CVD), plasma enhanced CVD (PECVD), plasma vapor deposition (PVD), sputtering, atomic layer deposition (ALD), or the like.

FIG. 1B shows the substrate 110 after the photoresist 150 is exposed using a patterned mask (not shown), and the openings 152 are etched, using a wet or dry etching process.

FIG. 1C shows the substrate 110 after an ashing step (e.g., oxygen plasma etching) is performed to remove the resist material 150 above the first dielectric layer 130. The ashing step also transforms the exposed side surface portions of the first dielectric layer 130 within the openings 152 to form layers of transformed material 132 lining the openings 152. The transformed material 132 may have a thickness between about 50 Angstroms and about 500 Angstroms.

If the first dielectric material 130 is an SiCO:H material, the transformed dielectric material 132 is a carbon depleted SiCO:H material. The extent of the conversion of dielectric material 130 to the dielectric material 132 depends on the type of SiCO:H material used and the porosity and carbon content of the SiCO:H material. If the carbon is substantially removed from a SiCO:H material, the resulting transformed semiconductor material 132 is more susceptible to HF etching or other acids (during the removal process).

In alternative embodiments, the exposed side surface of the ILD 130 is chemically and/or mechanically transformed, to become etchable by a first etching substance. The local conversion of the dielectric material may be achieved during anisotropic etching of the material in oxygen containing plasma or ex-situ by performing an oxidizing step (e.g., a UV/ozone treatment or supercritical carbon dioxide with addition of an oxidizer). The transformation of the first dielectric material 130 to material 132 may also be accomplished using an inert gas plasma and ion bombardment (so called, "mechanical conversion"). Ion implantation or plasma treatment with chemically reactive species may also convert the ILD sidewalls.

In other embodiments, the transformation of the surface dielectric material may be accomplished by a different process, such as, but not limited to, ion implantation, a plasma process, an immersion process, a thermal process, or a decomposition process.

FIG. 1D show the substrate 110 after a layer of the protective dielectric material 160 is deposited over the ARC layer 140 and on the sidewalls and bottom of the openings. The protective dielectric material 160 is deposited using a chemical vapor deposition (CVD) process. For example, a Plasma-Enhanced CVD process may be used.

FIG. 1E shows the substrate 110 after an anisotropic etching process (e.g., a dry etching process) is performed. The protective dielectric material 160 is removed from above the ARC layer 140 and from the bottom of the openings 152. The protective dielectric material 160 remains on the sidewalls of the openings. Portions of the etch stop layer 120 in the bottoms of the openings may also be removed by the anisotropic etch process.

FIG. 1F shows the substrate 110 after lining a surface of the protective dielectric layer 160 with a barrier layer 170 (e.g., TaN) to form a lined opening, and substantially filling the lined opening with a conductive material 180. The barrier layer 170 is formed over the ARC layer 140 and on the sides and bottoms of the openings, and prevents migration of the conductive material 180 into the substrate 110. The barrier layer 170 may be formed by PVD, CVD or other suitable deposition process like electrochemical plating or electroless plating technique. The conductive material 180 may be deposited by any suitable process, such as electrochemical plating or CVD, for example.

FIG. 1G shows the substrate after a material removal step, such as chemical mechanical polishing (CMP). The CMP step removes the ARC layer 140 and any of the conductive material 180, barrier layer material 170, and protective dielectric material 132 located above the top surface of the first dielectric layer 130. The dielectric layer 130 and conductive material 180 are exposed, along with the top ends of the transformed dielectric material 132, protective dielectric material 160 and barrier layer 170.

FIG. 1H shows the substrate after a selective treatment for removing the transformed dielectric material 132. For example, the substrate 110 may be dipped or immersed in a wet etch solution containing HF, vapor-type etchant, such as vapor HF or other acids. The air gaps 190 are left at the locations previously occupied by the transformed material, surrounding the barrier layer 170 and conductive material 180. In other embodiments, the transformed dielectric material 132 may be removed using an HF vapor, diluted HF, or a plasma etch using fluorine-containing plasma.

Referring again to FIG. 1I, the capping layer 192 is deposited over the top of the first dielectric material 130, and seals the air gaps 190. Some amount of the capping layer material (e.g., SiC) enters and seals the gaps 190, as a natural result of applying material to a high aspect ratio gap 190.

Figure 1J:
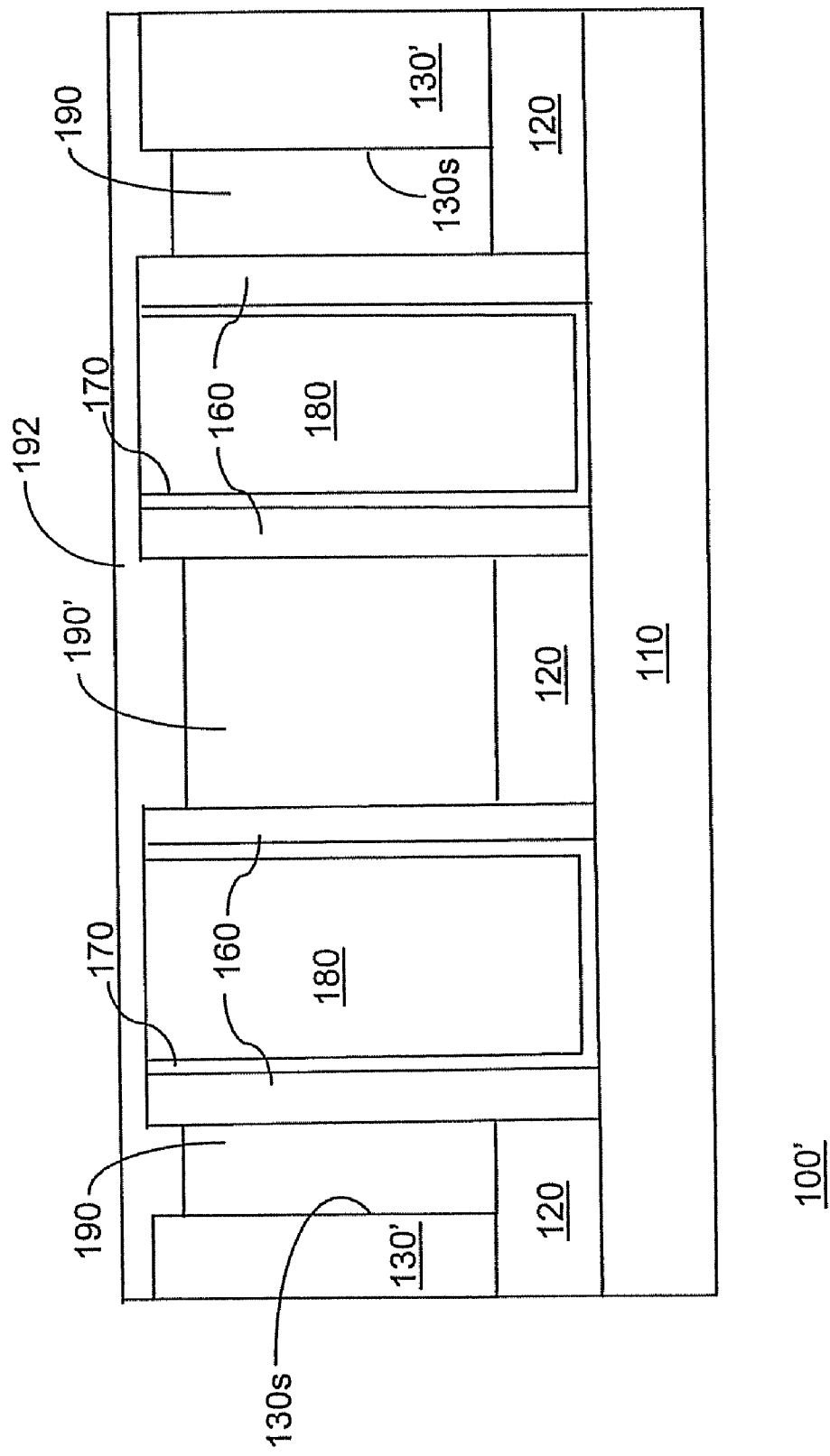

FIG. 1J shows a variation of the construction of FIG. 1I. In FIG. 1J, the structure 100' is similar to that in FIG. 1I, and like reference numerals denote the same items. In the configuration of FIG. 1J, as a result of increased ashing and/or wet etching, a the first dielectric material 130' is over-etched, so that the portion of the first dielectric material between the two conductive lines 180 is completely removed, forming a single enlarged air gap 190' between the lines 180. In some embodiments, this result may be desired, to further lower the interconnect capacitance and increase insulation between the two lines 180. One of ordinary skill in the art can determine whether this structure is preferred for a given package construction, taking into account the mechanical properties of the substrate 110, the ILD 130, and the package substrate (not shown) on which the die is to be mounted.

In the case of the trench for forming a conductive line (regardless of whether single or dual damascene), where the protective dielectric layer 160 has a thickness, the opening in the first dielectric layer 130 is sized to be larger than the critical dimension (CD) by an amount that is about twice the thickness of the protective dielectric layer. (There is a protective dielectric layer on each side of the trench, so the thickness is multiplied by two.) For example, if the CD is 600 Angstroms, and the thickness of the protective dielectric material is 100 Angstroms, then the after etch inspection (AEI) trench size is at least about 800 Angstroms.

FIGS. 2A to 2G show a method for forming second and subsequent ILD levels above the first level structure 100 shown in FIG. 1I.

FIG. 2A shows the structure of FIG. 1I after the second level ILD layer 210 is deposited over the capping layer 192; the ARC layer 220 is deposited; a photoresist layer (not shown) is applied over ARC layer 220 and patterned using a photolithography step; the V1 via openings are etched; and the photoresist (not shown) has been removed by ashing. The opening etch and ashing step transforms the exposed surface of the ILD layer 210 to form the transformed material 212 on the surface of the V1 via opening. The second ILD layer 210 is made from the same first dielectric material as the first level ILD layer 130, and the list of examples set forth above is not repeated. Preferably, the V1 via opening is centered above the opening containing the conductive line 180, but the structure and method described herein allow an alignment margin, so long as the V1 via opening at least partially overlies the conductive line 180.

FIG. 2B shows the structure of FIG. 2A after the M2 trench pattern is etched. A photoresist layer (not shown) is applied over ARC layer 220 and patterned using a photolithography step; the M2 trenches are etched; and the photoresist (not shown) has been removed by ashing. The trenches etch and ashing step transforms the exposed surface of the ILD layer 210 to form the transformed material 212 on the sides and bottom of the M2 trench. The transformed material is now continuous along the side walls of the M2 trench, the bottom of the trench, and the via V1.

FIG. 2C shows the structure of FIG. 2B after a layer of the protective dielectric material 230 is deposited by chemical vapor deposition (CVD) process, so as to substantially conformally coat the side walls of the M2 trench and V1 via and the bottom of the trench. Preferably the protective dielectric material 230 is formed by plasma-enhanced CVD. To reduce the capacitance, the thickness of the protective dielectric material 230 is less than about 30 nm, preferably less than about 15 nm. The protective dielectric material 230 can be any dielectric material, for example, silicon oxide, TEOS oxide, silicon carbide (SiC), silicon nitride, silicon oxynitride, PSG and CVD polymers. To further reduce the capacitance, the protective dielectric material 230 is low-k material, for example, carbon-doped silicon oxide or FSG. Preferably the dielectric constant of the protective dielectric material 230 is less than about 5.0.

FIG. 2D shows the structure of FIG. 2C after using an anisotropic removal process (e.g., anisotropic dry etch) to remove the protective dielectric material 230 from the bottom of the via and from above the ARC layer 220. In preferred embodiments, the protective dielectric material is not removed from the bottom of the trench. In other embodiments, the protective dielectric material 230 is also removed from the bottom of the trench. The remaining etch stop material 192 at the bottom of the V1 via is also removed, to expose the top of the M1 conductive line 180.

FIG. 2E shows the structure of FIG. 2D after depositing the barrier layer 240 (e.g., TaN), to form a lined opening, and filling the opening with the conductive material 250 (e.g., copper).

FIG. 2F shows the structure of FIG. 2E, after performing a material removal step, such as CMP, to remove excess copper 250, ARC 220, and any portions of the barrier layer 240 and protective dielectric material 230 extending above the top of the second level ILD 210.

Referring again to FIG. 2G, the completed second interconnect level structure 200 is shown, after performing a wet etching step to remove the transformed dielectric material 212 (to form the air gaps 260), and depositing the capping layer 270 (e.g., SiC), which seals the air gaps.

The above described process is self-aligned. The step of depositing the protective dielectric layer 230 and the wet etch step to remove the transformed dielectric material 212 can be added to an existing damascene process without increasing the number of photomasks or performing additional patterning steps. Thus, the formation of a protective dielectric layer and an air gap can be achieved with minimal disturbance to an existing damascene process. Because the use of an additional photomask in a process would be likely to cause a Misalignment, the ability to form the air gaps and protective dielectric layers without increasing the number of photomasks ensures proper alignment among the air gap and protective dielectric layer with respect to the via and trench.

Although FIGS. 2A to 2G show only the first dual damascene level (M2/V1), it will be understood that the same method and structure can be applied at any or all subsequent interconnect levels.

Figure 2H:
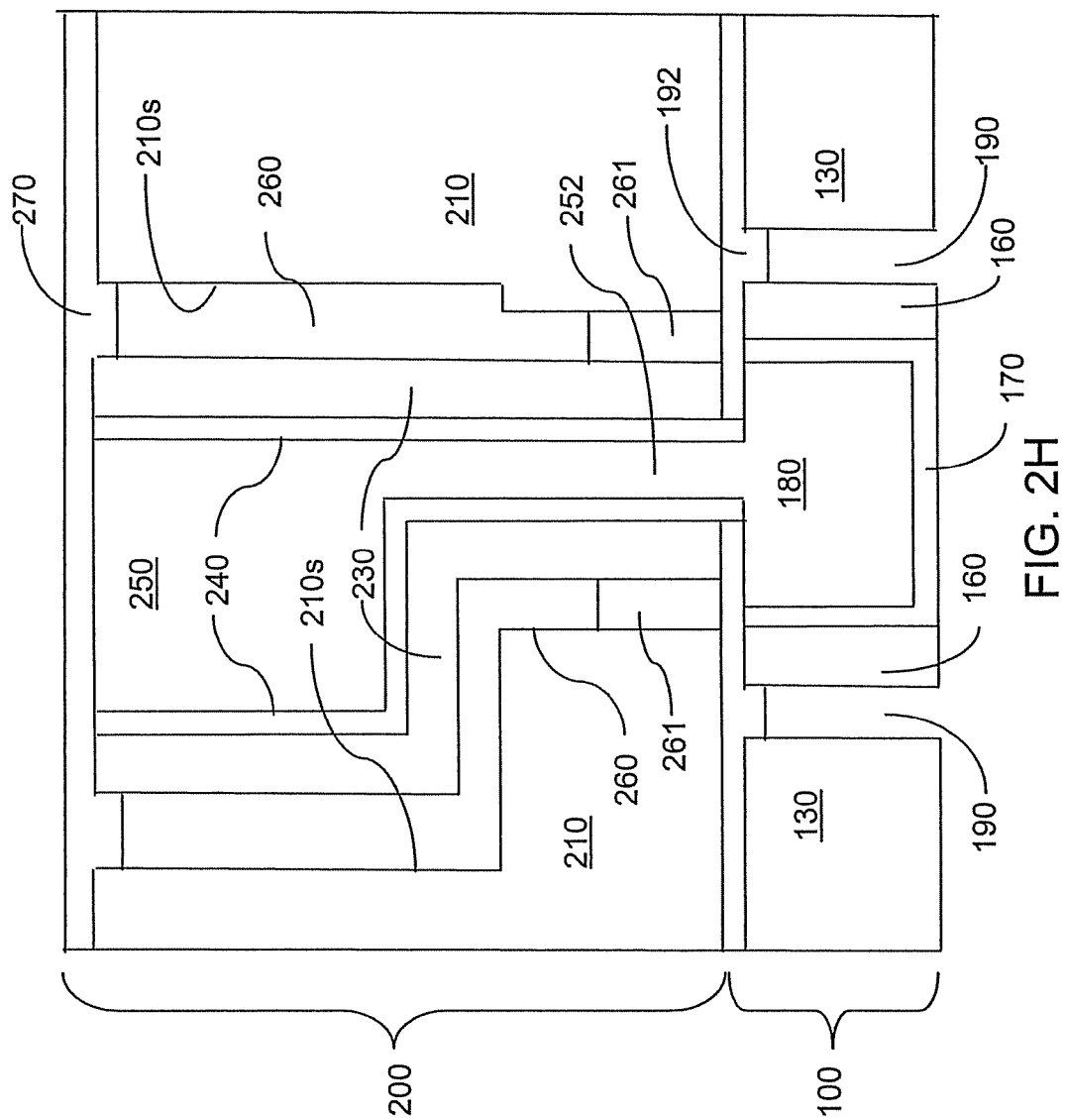

In the example described above, the wet etching removes all the transformed material. In some embodiments, wet etching may not go deep enough to remove all the transformed materials. The air gap may only extend to part of via depth. Some transformed material is mixed with air gap. FIG. 2H shows an example in which all elements of the structure are the same as the like-numbered elements of FIG. 2G. The air gap 260 only extends partway into the via V1, and transformed material 261 remains at the bottom portion of the via, or the transformed material even remains at the bottom of M2 trench, if wet etching doesn't penetrate deep enough. This variation may be used as a technique to fine tune the capacitance and reliability by controlling the wet etching time to partially remove transformed material and produce an air gap that extends for only a portion of the via depth.

FIGS. 3A to 3F show a variation of the structure 200, and a method for forming this variation, using an etch stop layer between the trench and via portions of the second level ILD.

Figure 3A:
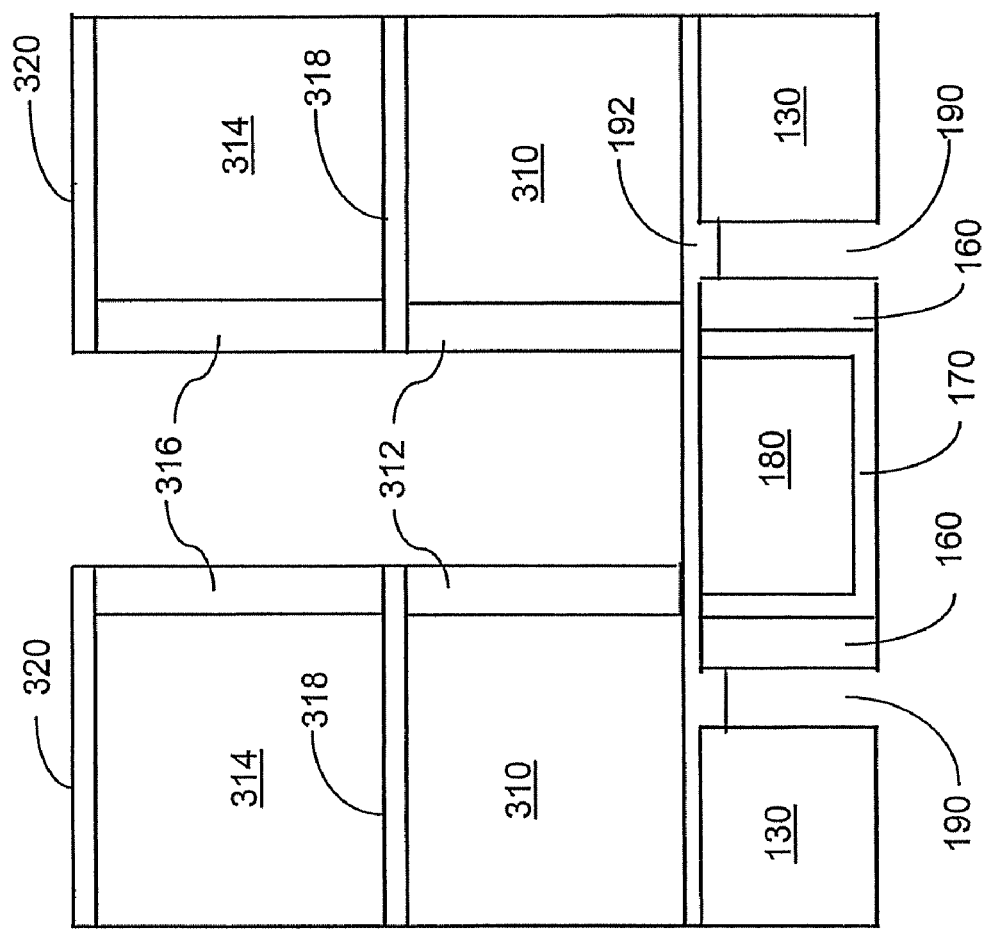
FIGS. 3A to 3F show a variation of the dual damascene structure and method of FIGS. 2A to 2G.

FIG. 3A shows the structure of FIG. 1I after the second level ILD portion 310 is deposited over the capping layer 192; an etch stop layer 318 (e.g., SiC) is deposited on ILD 310; the ILD portion 314 is deposited over etch stop layer 318, the ARC layer 320 is deposited; a photoresist layer (not shown) is applied over ARC layer 320 and patterned using a photolithography step; the V1 via openings are etched; and the photoresist (not shown) has been 15 removed by ashing. The ashing step transforms the exposed surface of the ILD layer 310, 314 to form the transformed material 312, 316 on the surface of the V1 via opening. The second ILD layer 310, 314 is made from the same first dielectric material as the first level ILD layer 130, and the list of examples set forth above is not repeated.

Figure 3B:
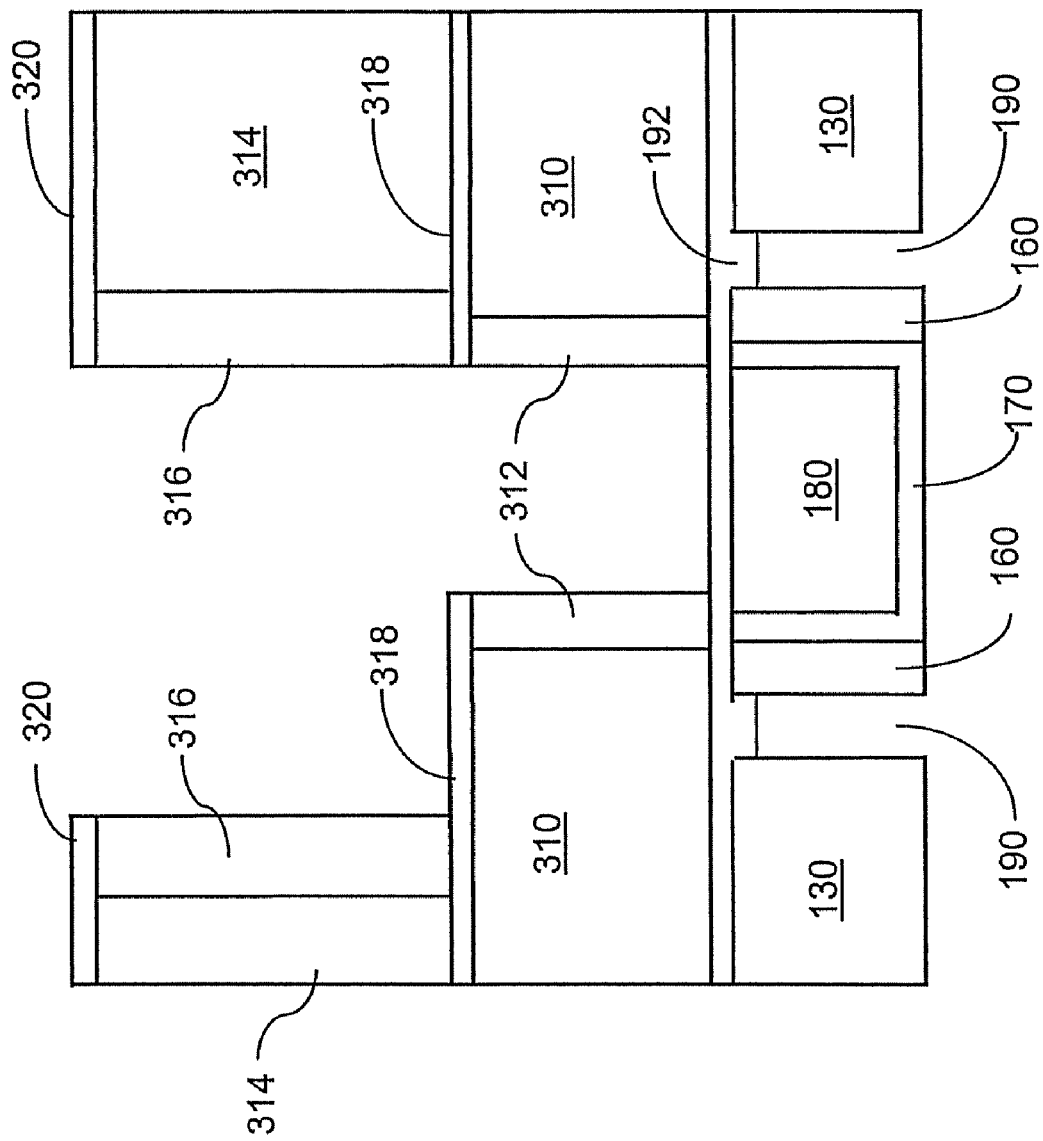

FIG. 3B shows the structure of FIG. 3A after the M2 trench pattern is etched. A 20 photoresist layer (not shown) is applied over ARC layer 320 and patterned using a photolithography step; the M2 trenches are etched; and the photoresist (not shown) has been removed by ashing. The ashing step transforms the exposed surface of the ILD layer 310, 314 to form the transformed material 312, 316 on the side walls of the M2 trench.

Figure 3C:
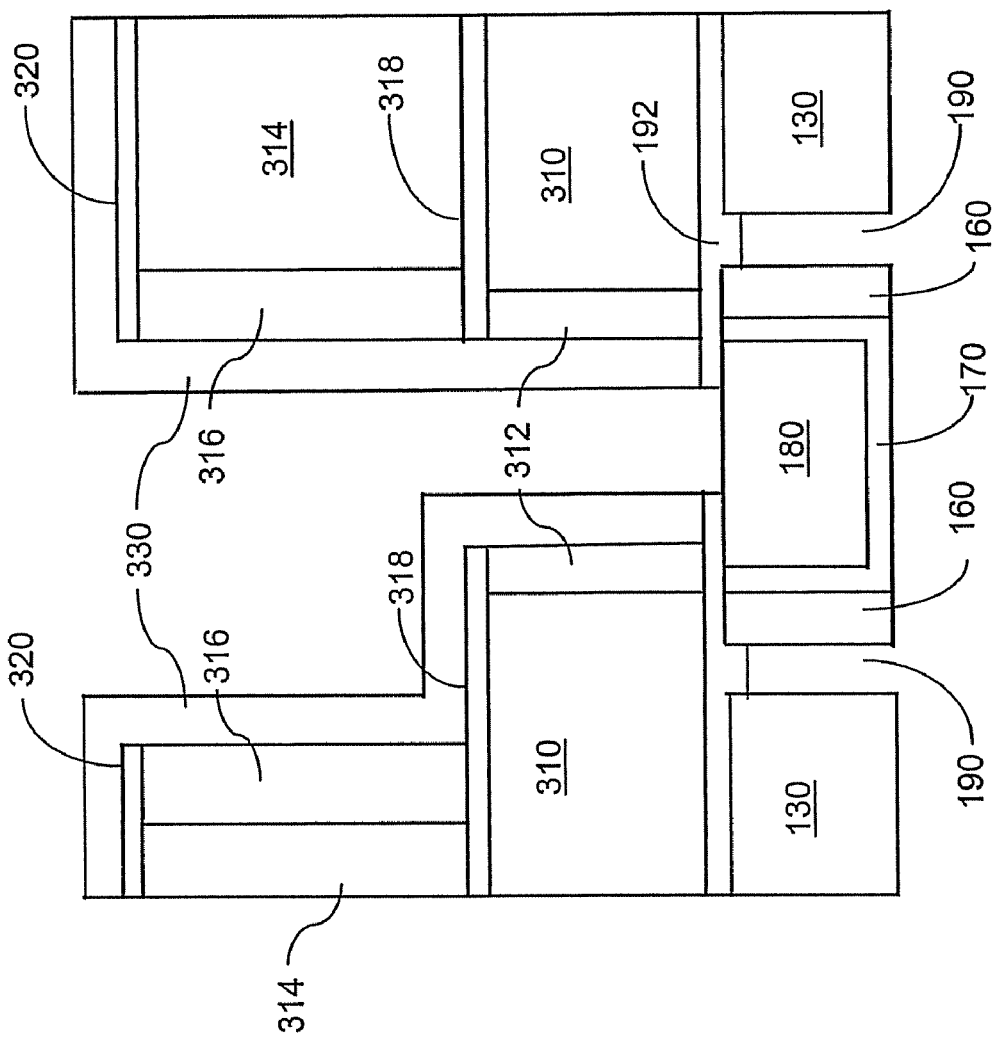

FIG. 3C shows the structure of FIG. 3B after a layer of the protective dielectric 25 material 330 is deposited by chemical vapor deposition (CVD) process, so as to conformally coat the side walls of the M2 trench and V1 via and the bottom of the trench.

Figure 3D:
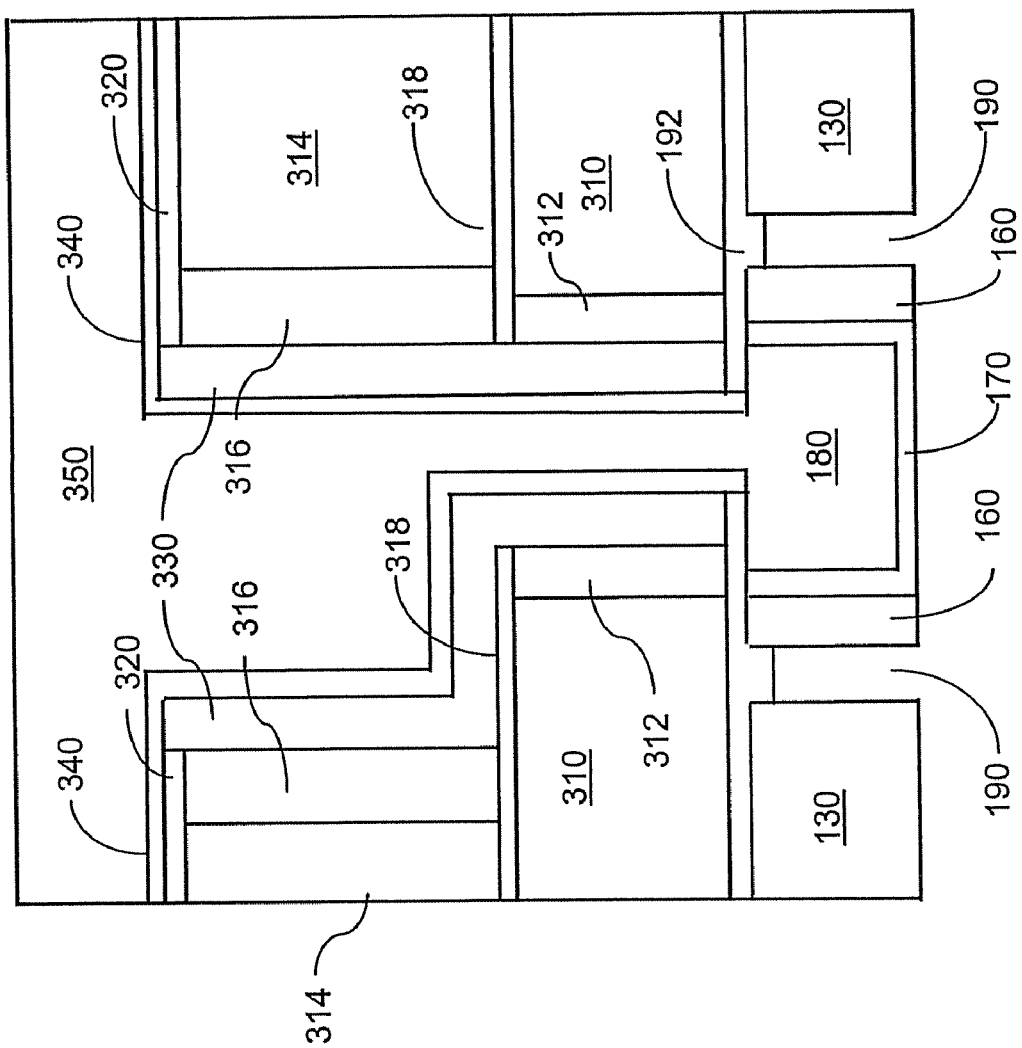

FIG. 3D shows the structure of FIG. 3C after using an anisotropic removal process (e.g., anisotropic dry etch) to remove the protective dielectric material 330 from the bottom of the via and from above the ARC layer 220. In preferred embodiments, the protective 30 dielectric material is not removed from the bottom of the trench. In other embodiments, the protective dielectric material 230 is also removed from the bottom of the trench. The remaining etch stop material 192 at the bottom of the V1 via is also removed, to expose the top of the M1 conductive line 180. The barrier layer 340 (e.g., TaN) is deposited, to form a lined opening, and filling the opening with the conductive material 350 (e.g., copper).

Figure 3E:
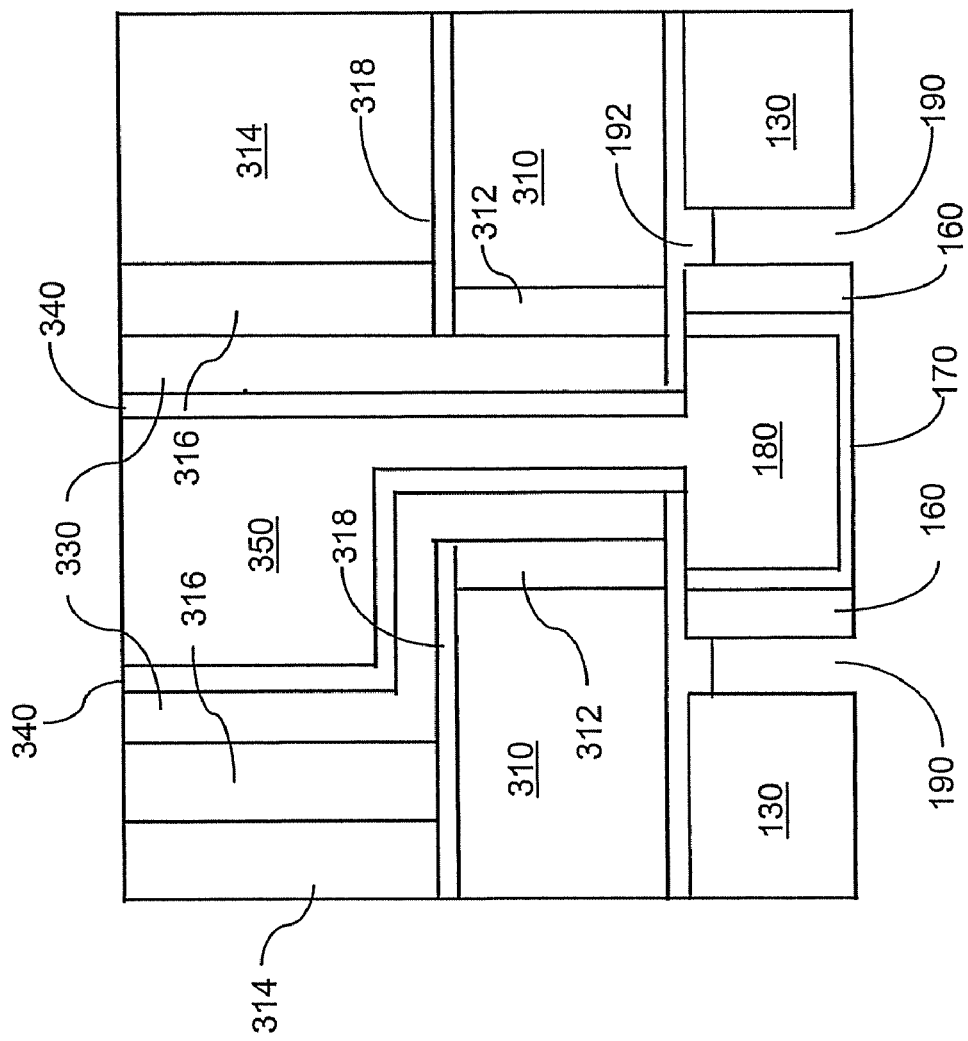
Figure 3F:
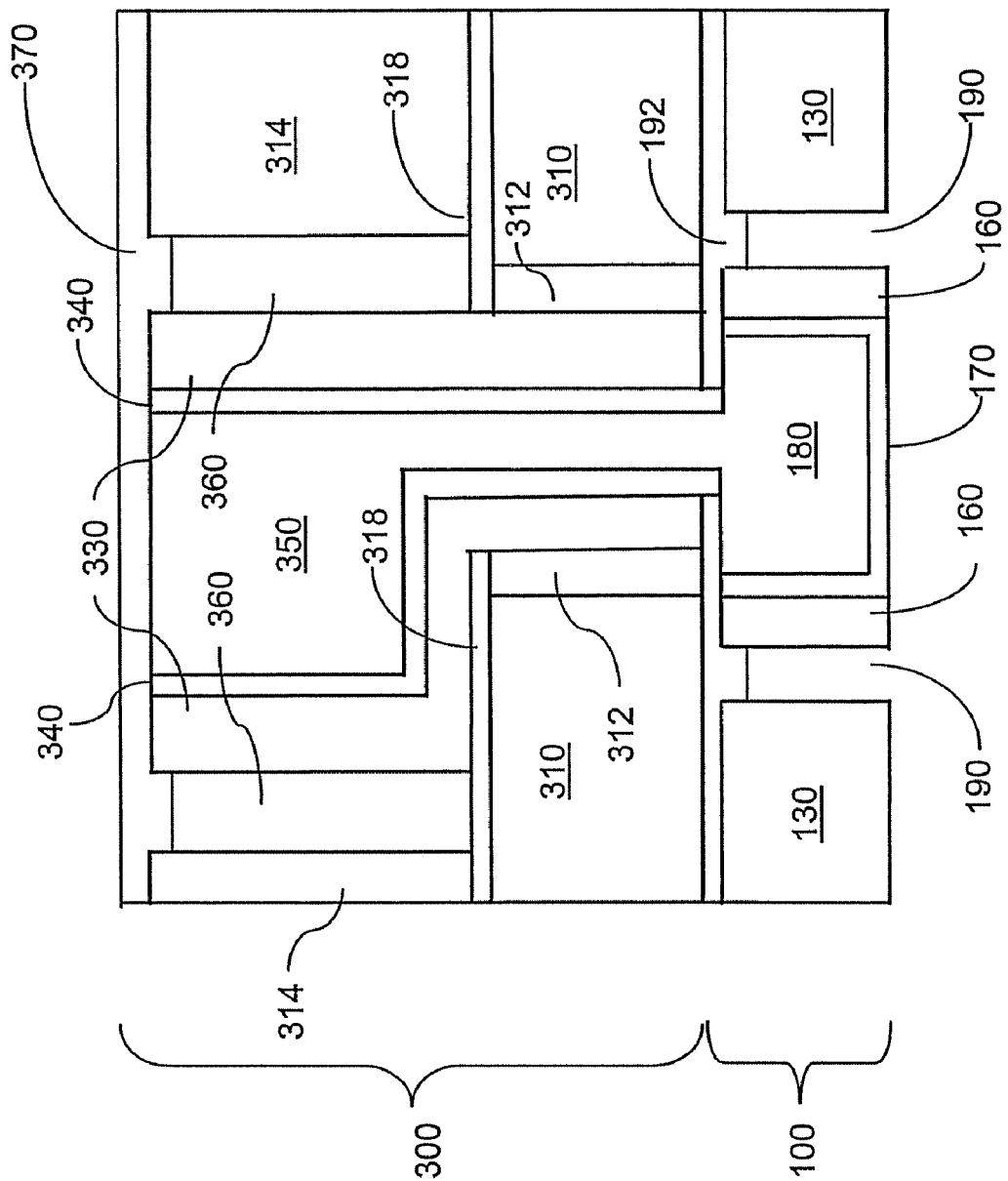

FIG. 3E shows the structure of FIG. 3D, after performing a material removal step, such as CMP, to remove excess copper 350, ARC 320, and any portions of the barrier layer 340 and protective dielectric material 330 extending above the top of the second level ILD 314.

Referring again to FIG. 3F, the completed second interconnect level structure 300 is shown, after performing a step to remove the transformed dielectric material 316 (to form the air gap 360), and depositing the capping layer 370 (e.g., silicon carbide; SiC), which seals the air gaps. The transformed dielectric material 316 can be removed by dry or wet etching. For example, a wet etching method includes using an HF solution or vapor HF. For a smaller size of transformed dielectric material 316, removal by vapor-type etchant or plasma etching is preferred to ensure that there is no residue inside the air gap.

Note that in the variation of FIGS. 3A to 3F, the air gaps are formed along the conductive lines 180, 350 in the M1 and M2 levels, but not alongside the vias. However, the protective dielectric material 330 is formed adjacent to the conductive lines and conductive vias.

Although FIGS. 3A to 2F show only the first dual damascene level (M2/V1), it will be understood that the same method and structure can be applied at any or all subsequent interconnect levels.

Figure 4:
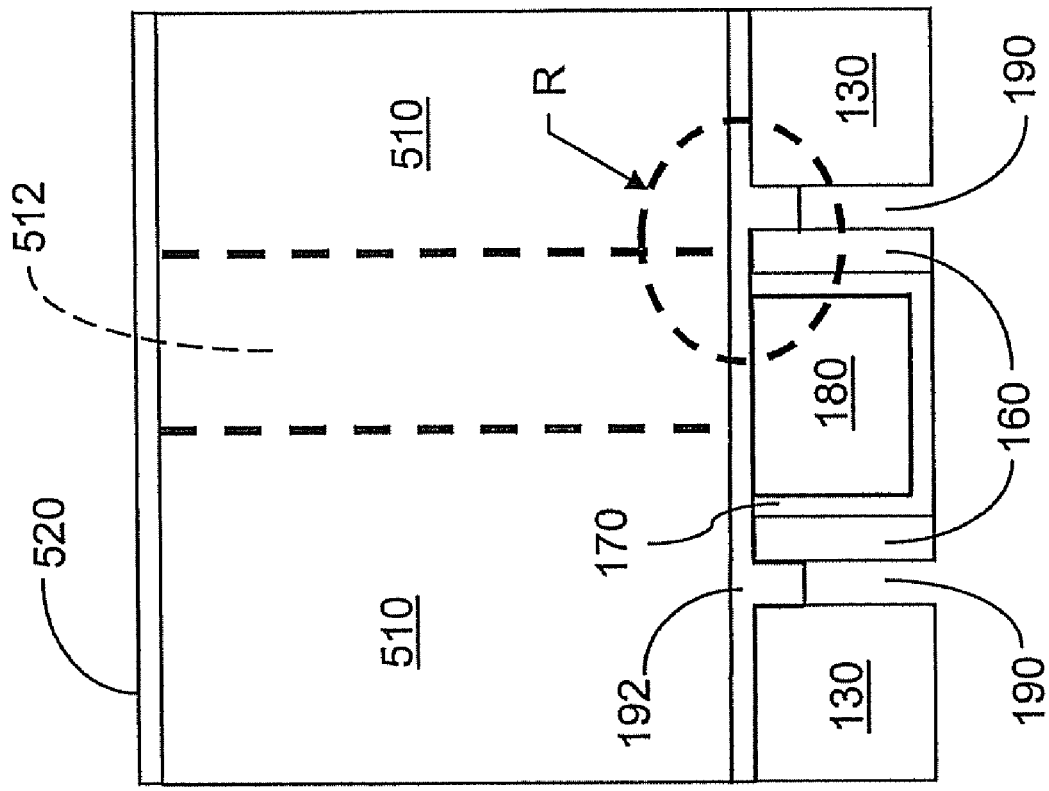
FIG. 4 shows the effect of a misalignment between the M1 and V1 layers.

FIG. 4 shows an example demonstrating the isolating function of the capping layer 192. In FIG. 4, the V1 layer 510 is not properly aligned with the M1 layer 130. As a result, via 512 is an unlanded via. In this structure, there is no leakage or migration of the conductive material from via 512 into the air gap 190 for two reasons: (1) the capping layer 192 seals the air gap 190; and (2) the protective dielectric material 160 provides an process extra margin by preventing any leakage or migration of the conductive material in via 512 when the misalignment causes the V1 via 512 to overlap the protective dielectric material 160.

FIG. 4 shows how the structures described above avoid problems when a mis-alignment between levels results in an unlanded via 512. In FIG. 4, the second ILD layer 510 is deposited and patterned with a mis-aligned mask (not shown). As a result, the via 512 is not centered above the M1 conductor 180, and extends beyond the edge of the barrier layer 170. The capping layer 192 prevents a hole from being formed in the barrier layer of the second interconnect level when the latter is formed, thus preventing leakage and copper migration. The protective dielectric material 160 also provides additional margin for the alignment of the second level via. Thus, there is no leakage or copper migration, so long as the opening 512 of the second dielectric layer 510 at least partially overlies the conductive line 180 of the first dielectric layer The methods and structures described herein maintain device and package reliability. The method and structure allows reduction in interconnect capacitance while keeping the same ILD material. The overall ILD film strength is preserved, which helps to maintain the same level of device and package reliability.

Using the method and structure described herein interconnect capacitance is reduced while keeping the same cost structure. A process using this technique can be implemented without significant disturbance to the current low-k/Cu baseline.

Removal of the ILD material that is transformed during ashing or etching eliminates a damage zone in the dielectric (i.e., a zone having increased k value). The insertion of air gaps is a self-aligned process, which further reduces interconnect capacitance.

The methods and structures described above do not introduce new thermal dissipation issues. Because interconnect capacitance can be reduced without changing the ILD material, the impact of this method and structure on thermal dissipation is relatively small.

Although specific examples of materials and process steps for forming the interconnect structure are described above, one of ordinary skill in the art can readily substitute other materials and/or process steps, whether currently known or developed in the future. For example, any of the materials and process steps described in U.S. Patent Application Publication No. US 2005/0074961 may be substituted for materials or process steps that perform the same function in the structures described above.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A structure, comprising:
   a semiconductor substrate;
   a layer of a first dielectric material above the substrate;
   a conductive pattern formed within the layer of the first dielectric material, the conductive pattern having a bottom and a sidewall, wherein the conductive pattern has a diffusion barrier lining the bottom and sidewall thereof;
   a second dielectric material covering the entire sidewall of the conductive pattern,
   the layer of the first dielectric material having an air gap therein, separating the second dielectric material and the first dielectric material, wherein the second dielectric material is distinct from the diffusion barrier, and abuts the entire sidewall of the diffusion barrier continuously from a bottom of the diffusion barrier to a top of the diffusion barrier, and
   a capping layer above the first dielectric layer, the capping layer isolating the air gap from a structure above the capping layer.

2. The structure of claim 1, wherein the dielectric constant of the first dielectric material is less than about 3.6.

3. The structure of claim 1, wherein the second dielectric layer is a low-k dielectric material.

4. The structure of claim 1, wherein the second dielectric layer comprises carbon-containing material.

5. The structure of claim 1, wherein the second dielectric layer is one of the group consisting of silicon carbide, carbon-doped silicon oxide, silicon oxide, silicon oxynitride, silicon nitride, FSG, TEOS oxide, PSG, and a CVD polymer.

6. The structure of claim 1, wherein the second dielectric layer comprises a low-k dielectric material with a dielectric constant less than about 5.0.

7. The structure of claim 1, wherein:
the structure is a dual damascene structure;
the conductive pattern includes a conductive line and a conductive via, and
the second dielectric material makes continuous contact with sides and a bottom of the conductive line and with sides of the conductive via.

8. The structure of claim 7, wherein the air gap extends continuously, adjacent to portions of the second dielectric material along sides and a bottom of the conductive line and along sides of the conductive via.

9. The structure of claim 7, wherein the air gap extends only partway along the length of the conductive via.

10. The structure of claim 1, wherein the second dielectric material is configured to provide mechanical support and protection for the conductive pattern and prevent stress migration and electromigration.

11. The structure of claim 1, wherein the second dielectric material is configured to protect the entire sidewalls of the diffusion barrier from an etchant used to form the air gap.

12. A structure, comprising:
a semiconductor substrate;
a first dielectric layer and a second dielectric layer above the substrate;
a respective conductive pattern within each of the first and second dielectric layers, the conductive patterns having sidewalls entirely covered with a diffusion barrier layer, the conductive pattern of the second dielectric layer at least partially overlying the conductive pattern of the first dielectric layer;
a second dielectric material covering the entire sidewalls of the diffusion barrier layers of the conductive patterns in the first and second dielectric layers,
at least one of the first and second dielectric layers having an air gap between the second dielectric material and the respective one of the first and second dielectric layers; and
a capping layer between the first and second dielectric layers, the capping layer isolating the air gap in the one of the first and second dielectric layers from the conductive pattern in the other of the first and second dielectric layers.

13. The structure of claim 12, wherein the second dielectric layer comprises a low-k dielectric material with a dielectric constant less than about 5.0.

14. The structure of claim 12, wherein the second dielectric layer is one of the group consisting of silicon carbide, carbon-doped silicon oxide, silicon oxide, silicon oxynitride, silicon nitride, FSG, TEOS oxide, PSG, and a CVD polymer.

15. The structure of claim 12, wherein the capping layer is formed of at least one of the group consisting of silicon carbide, silicon nitride, and a PSG layer.

16. The structure of claim 12, wherein the diffusion barriers are located between each respective conductive pattern and the second dielectric material, the second dielectric material being distinct from the diffusion barrier.

17. A method of forming a semiconductor structure, comprising the steps of:
(a) providing a first dielectric layer with an opening above a substrate;
(b) transforming an exposed surface portion of the first dielectric layer in the opening;
(c) forming a second dielectric layer covering an entire sidewall of the transformed portion of the first dielectric layer;
(d) lining the opening with a diffusion barrier and filling the lined opening with a conductive material, so that the diffusion barrier is located between the conductive material and the second dielectric material, and the second dielectric material is distinct from the diffusion barrier; and
(e) removing the transformed portion of the first dielectric layer to form an air gap between the second dielectric layer and a remaining portion of the first dielectric layer; and
(f) forming a capping layer above the substrate to seal the air gap.

18. The method of claim 17, wherein the second dielectric layer is one of the group consisting of silicon carbide, carbon-doped silicon oxide, silicon nitride, FSG, TEOS oxide, PSG, and a CVD polymer.

19. The method of claim 17, wherein the removing step includes a wet or dry etching step.

20. The method of claim 17, wherein the wet etching step includes exposing the transformed portion to a solution that includes HF.

21. The method of claim 17, wherein the removing step comprises using a vapor-type solution.

22. The method of claim 17, wherein the step of forming a second dielectric layer includes:
depositing second dielectric material over the substrate and in the opening; and
performing an etching step to remove the second dielectric material from a top surface of the substrate and from a bottom surface of the opening.

23. The method of claim 17, wherein steps (b) through (e) are performed for each interconnect level of an integrated circuit.

24. The method of claim 17, wherein the second dielectric layer forming step includes performing chemical vapor deposition.

25. The method of claim 17, wherein the second dielectric material has a dielectric constant of about 10 or less.

26. The method of claim 17, wherein the first dielectric layer comprises a low-k dielectric material with a dielectric constant less than about 3.6.

27. The method of claim 17, wherein the first dielectric layer comprises carbon-doped silicon oxide or FSG.

* * * * *